(12) United States Patent
Ito et al.

(10) Patent No.: US 7,216,198 B2
(45) Date of Patent: May 8, 2007

(54) DRAM WITH SUPER SELF-REFRESH AND ERROR CORRECTION FOR EXTENDED PERIOD BETWEEN REFRESH OPERATIONS

(75) Inventors: Yutaka Ito, Tokyo (JP); Takayuki Aisu, Tokyo (JP); Yukihide Suzuki, Tokyo (JP)

(73) Assignees: Elpida Memory, Inc.; Hitachi Ulsi Systems Co., Ltd.; Hitachi Ltd.

( * ) Notice: Subject to any disclaimer, the term of this patent is extended or adjusted under 35 U.S.C. 154(b) by 258 days.

(21) Appl. No.: 10/699,223

(22) Filed: Oct. 30, 2003

(65) Prior Publication Data

US 2004/0221098 A1   Nov. 4, 2004

(30) Foreign Application Priority Data

Oct. 30, 2002   (JP)   ............................. 2002/315319

(51) Int. Cl.
G06F 12/16 (2006.01)
G06F 12/12 (2006.01)

(52) U.S. Cl. ............................ 711/106; 714/14; 714/42
(58) Field of Classification Search ................ 711/106, 711/161, 162; 714/1, 6, 48, 52
See application file for complete search history.

(56) References Cited

U.S. PATENT DOCUMENTS 5,450,422 A * 9/1995 Dell ........................... 714/773
6,199,139 B1 * 3/2001 Katayama et al. .......... 711/106
6,829,677 B1 * 12/2004 Attaway et al. ............. 711/106
2002/0018389 A1   2/2002 Ito et al.
2002/0133663 A1 * 9/2002 Sawhney ..................... 711/1
2003/0061536 A1 * 3/2003 Nakai et al. .................. 714/14
2003/0149929 A1 * 8/2003 White ......................... 714/766
2004/0243886 A1 * 12/2004 Klein .......................... 714/42

FOREIGN PATENT DOCUMENTS

JP   362078920 A * 4/1987 ................. 714/746

* cited by examiner

Primary Examiner—Donald Sparks
Assistant Examiner—James Golden
(74) Attorney, Agent, or Firm—Ostrolenk, Faber, Gerb & Soffen, LLP

(57) ABSTRACT

In a semiconductor integrated circuit device, a command decoder is adapted to receive not only an external command but also an internal command. An ECC controller has a command generator and an address generator. When the command decoder decodes an external entry command, the command generator instructs encoding to an ECC-CODEC circuit and the address generator sequentially produces addresses which are supplied to a memory array. The ECC-CODEC circuit produces check bits for error detection/correction with reference to information data of the memory array. Upon completion of an encoding operation of writing the check bits into a predetermined region of the memory array, the ECC controller delivers an end signal to the command decoder as the internal command to make a super self-refresh control circuit start a super self-refresh operation.

12 Claims, 32 Drawing Sheets

Sequence of Super Self-Refresh Operation (Entry/Exit Scheme)

Example 1 of Super Self-Refresh Internal Operation
(Parity-Generation (1) Parity Bit Calculation)

Example 1 of Super Self-Refresh Internal Operation
(Parity-Generation (2) Parity Bit Writing)

Example 2 of Super Self-Refresh Internal Operation
(Correct (1) Syndrome Calculation)

Example 2 of Super Self-Refresh Internal Operation
(Correct (2) Error Location Detection and Correction/Writing)

FIG. 13 Operation Sequence of BIST

Example 1 of Self-Test Operation
(Burst Length 1, No Error)

Example 2 of Self-Test Operation
(Burst Operation, Occurrence of Error, Reading of Result)

Sequence of Super Self-Refresh Operation (Entry/Exit Scheme)

DRAM WITH SUPER SELF-REFRESH AND ERROR CORRECTION FOR EXTENDED PERIOD BETWEEN REFRESH OPERATIONS

This invention claims priority to prior Japanese patent application JP 2002-315319, the disclosure of which is incorporated herein by reference.

BACKGROUND OF THE INVENTION

This invention relates to a semiconductor integrated circuit device including a memory device having a super self-refresh mode.

Basically, this invention relates to a memory device (for example, a DRAM of a clock synchronization type known as a SDRAM (synchronous dynamic random access memory) using a DRAM (dynamic random access memory) cell and relates to control of a refresh operation of reading charge information of the DRAM cell and rewriting the same before charges of the DRAM cell fade away and are lost. In particular, this invention relates to a super self-refresh operation which has a longer cycle as compared with a normal self-refresh operation.

United States Patent Application Publication No. 2002/0018389 A1 discloses a SDRAM having a super self-refresh mode. In order to achieve the super self-refresh mode, an example of the SDRAM disclosed in FIG. 1 of the above-mentioned publication comprises first through fourth ECC (error correcting code)-CODEC (coder-decoder) circuits as first through fourth coder/decoder circuits in one-to-one correspondence to first through fourth banks of the SDRAM and a control logic (i.e., a control circuit) connected to the first through the fourth ECC-CODEC circuits. In order to achieve the super self-refresh mode, another example of the SDRAM disclosed in FIG. 2 of the above-mentioned publication comprises a single ECC-CODEC circuit in common to first through fourth banks of the SDRAM and a control logic (i.e., a control circuit) connected to the ECC-CODEC circuit.

Furthermore, the above-mentioned publication discloses that, when a DRAM enters an operation mode in which only a data holding operation is performed, a check bit for error detection/correction for a plurality of data is generated and stored by using the ECC-CODEC circuit. Refresh operation is performed in a refresh cycle which is lengthened within an allowable range of error occurrence by an error correcting operation using the check bit (the refresh operation of such a long cycle is a super self-refresh operation). Before the DRAM returns from the data holding operation to a normal operation, an error bit is corrected by using the above-mentioned data and the check bit (paragraphs [0011] and [0012]).

However, the above-mentioned publication does not disclose a circuit structure of an ECC controller connected between the control logic of the SDRAM and the first through the fourth ECC-CODEC circuits or between the control logic of the SDRAM and the single common ECC-CODEC circuit to control the ECC-CODEC circuits or circuit under control of the control logic of the SDRAM.

It is therefore an object of this invention to provide a semiconductor integrated circuit device comprising an ECC controller for controlling an ECC-CODEC circuit under control of a control logic of an SDRAM.

Other objects of this invention will become clear as the description proceeds.

SUMMARY OF THE INVENTION

According to this invention, there are provided:

(1) A semiconductor integrated circuit device having a dynamic RAM, the dynamic RAM comprising a memory array, a RAM control section, an ECC-codec circuit, and an ECC controller, the RAM control section comprising a command decoding section responsive to an external command from the outside of the dynamic RAM for decoding the external command and a super self-refresh control circuit, wherein:

the command decoding section is also adapted to receive an internal command generated inside the dynamic RAM and to decode the internal command;

the ECC controller comprises a command generating section and an address generating section;

the command decoding section delivers a start instruction signal representative of encoding to the ECC controller when an entry command is decoded as the external command;

the command generating section of the ECC controller delivers, upon reception of the start instruction signal, a first operation mode signal representative of the encoding and simultaneously makes the address generating section of the ECC controller sequentially generate addresses corresponding to operation timings of the first operation mode signal and supplies the addresses to the memory array;

the ECC-codec circuit carries out, upon reception of the first operation mode signal, an encoding operation of producing a check bit for error detection/correction with reference to information data stored in the memory array and writes the check bit into a predetermined region of the memory array;

the command generating section of the ECC controller delivers, upon completion of the encoding operation by the ECC-codec circuit, a first end signal as the internal command to the command decoding section;

the super self-refresh control circuit of the RAM control section starts, when the command decoding section receives and decodes the first end signal as the internal command, a super self-refresh operation which has a refresh cycle lengthened within an allowable range of error occurrence by an error correcting operation using the check bit.

(2) A semiconductor integrated circuit device as described in (1), wherein:

the entry command is supplied by a user to the dynamic RAM.

(3) A semiconductor integrated circuit device as described in (1), wherein:

the command decoding section delivers, when an exit command as the external command is decoded, a stop instruction signal representative of decoding to the ECC controller;

the super self-refresh control circuit of the RAM control section finishes the super self-refresh operation when the command decoding section decodes the exit command;

the command generating section of the ECC controller delivers, upon reception of the stop instruction signal, a second operation mode signal representative of the decoding and simultaneously makes the address generating section of the ECC controller sequentially generate addresses corresponding to operation timings of the second operation mode signal and supplies the addresses to the memory array;

the ECC-codec circuit carries out, upon reception of the second operation mode signal, a decoding operation of reading the check bit for error detection/correction from the predetermined region of the memory array and corrects, with reference to the check bit and the information data stored in the memory array, an error in the information data to rewrite the information data;

the command generating section of the ECC controller delivers, upon completion of the encoding operation by the ECC-codec circuit, a second end signal as the internal command to the command decoding section.

(4) A semiconductor integrated circuit device as described in (3), wherein:

the entry command and the exit command are supplied by a user to the dynamic RAM.

(5) A semiconductor integrated circuit device has a dynamic RAM, the dynamic RAM comprising a memory array, a RAM control section, an error correction circuit, and a BIST (built-in self-test) controller, the RAM control section comprising a command decoding section responsive to an external command from the outside of the dynamic RAM for decoding the external command, wherein:

the command decoding section is also adapted to receive an internal command generated inside the dynamic RAM and to decode the internal command;

the BIST controller comprises a command generating section and an address generating section;

the command decoding section delivers a start instruction signal representative of checking to the error correction circuit when a BIST entry command is decoded as the external command;

the command generating section of the BIST controller delivers, upon reception of the start instruction signal, an operation mode signal representative of the checking and simultaneously makes the address generating section of the BIST controller sequentially generate addresses corresponding to operation timings of the operation mode signal and supplies the addresses to the memory array;

the error correction circuit produces, upon reception of the operation mode signal, write data corresponding to the addresses sequentially generated, writes the write data into a predetermined region or an entire region of the memory array, produces expectation data corresponding to the addresses sequentially generated, compares the expectation data with information data read from the memory array, detects an error in the information data, and, upon completion of error detection, delivers an end signal as the internal command to the command decoding section;

delivery of the operation mode signal being stopped when the command decoding section receives and decodes the end signal as the internal command.

(6) A semiconductor integrated circuit device as described in (5), wherein:

the BIST entry command is supplied by a user to the dynamic RAM.

DESCRIPTION OF THE PREFERRED EMBODIMENTS

Figure 1:
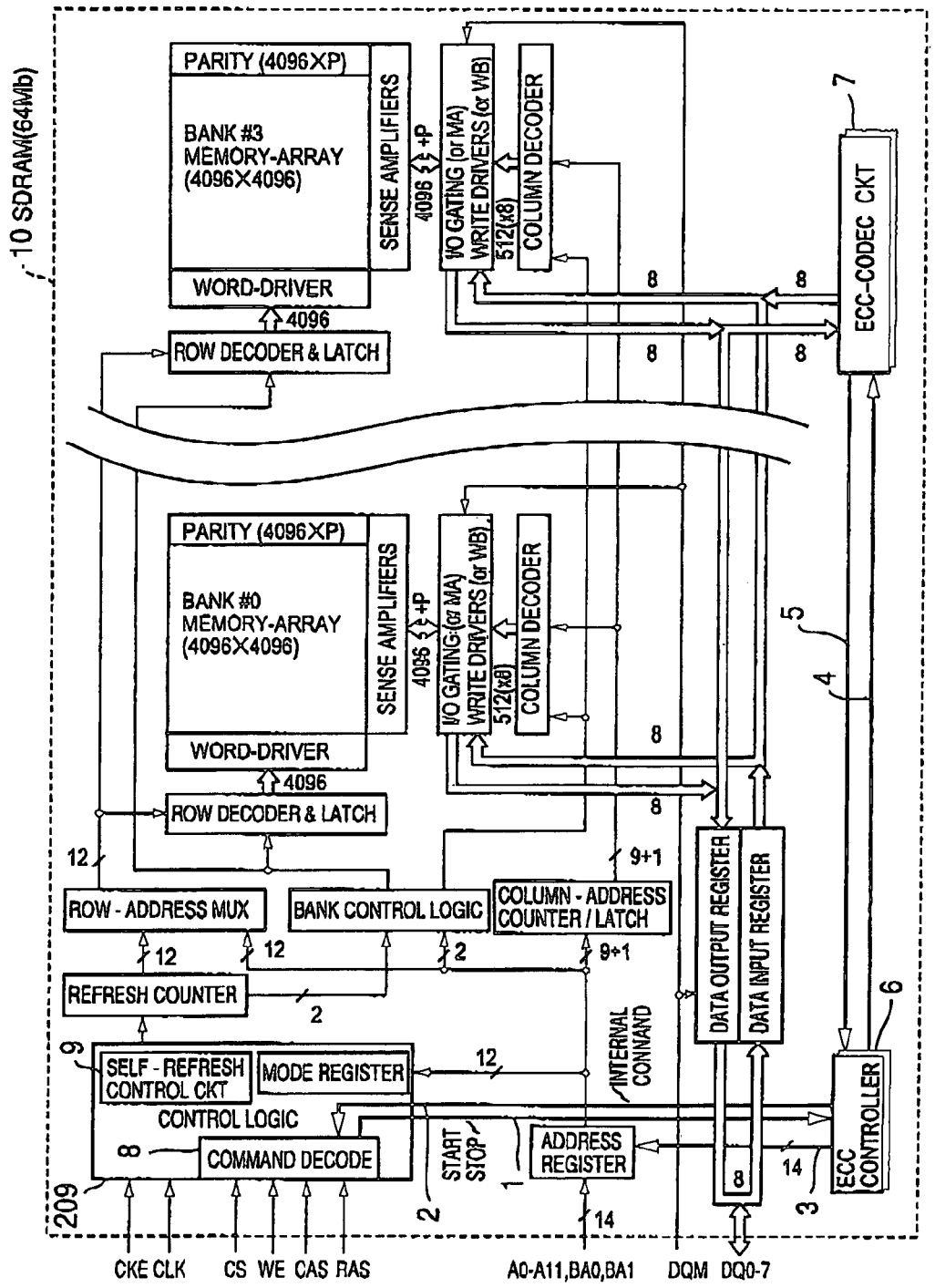
FIG. 1 is a block diagram of a semiconductor integrated circuit device according to one embodiment of this invention.

Now, description will be made of embodiments of this invention with reference to the drawing.

A super self-refresh (long-cycle self-refresh) operation addressed by this invention is not a typical refresh operation but is intended to minimize current consumption required in a refresh operation of a memory device. In case where a long-term suspension state is started without carrying out a memory operation (in case where such command is set to the memory device), power supply of the memory device is reduced to 0 V except specific parts (for example, a counter electrode potential of a memory cell capacitance, a cell plate, a control circuit or a counter of a refresh portion) to avoid useless current consumption. In addition, a refresh Interval of a DRAM cell is extended to several tens of times that of the typical refresh operation, for example, to 10 seconds. Thus, the number of times of refresh operations during a unit time period is reduced so as to save a refresh current.

In the super self-refresh operation, the number of times of refresh operations during a unit time period is reduced. In this event, charges may be lost and cell information may be collapsed in a very small part of cells (for example, spoiled or defective bit: tail bit: at the probability of occurrence of about 0.0037%). Therefore, a memory device having a super self-refresh mode is required to have an ECC (error correcting code)-CODEC (coder-decoder) circuit for recovering the information (correcting an error) for those cells.

Thus, the super self-refresh operation is self-refresh control characterized in that the ECC-CODEC circuit is mounted so as to allow a long-time refresh suspension period and that an internal power supply is reduced to 0 V during the refresh suspension period so as to achieve ultra-low current consumption.

Referring to FIG. 1, a semiconductor integrated circuit device according to one embodiment of this invention comprises a 64-Mb SDRAM 10 having a super self-refresh mode. The SDRAM 10 having a super self-refresh mode is a semiconductor dynamic memory for carrying out data input/output operations in synchronization with an external input clock CLK. The SDRAM 10 comprises first through fourth memory arrays (first through fourth banks #0 through #3). Among the first through the fourth banks #0 to #3, the second and the third banks #1 and #2 are not shown in the figure for convenience of illustration but are similar in structure to the first and the fourth banks #0 and #3. The semiconductor integrated circuit device has, as interfaces, clock terminals and control signal terminals including CLK (clock), CKE (clock enable), CS (chip select), WE (write enable), CAS (column address strobe), and RAS (row address strobe), address signal terminals including A0–A11 (memory array address) and BA0–BA1 (bank address), and data input/output signal terminals including DQM (data mask signal) and DQ0–DQ7 (data input/output signal).

Although not shown in the figure, the semiconductor integrated circuit device has Vcc and Vss (GND) terminals as external power supply terminals.

The semiconductor integrated circuit device further comprises a control logic (CONTROL LOGIC) 209 of the SDRAM 10, a single ECC-CODEC circuit 7 corresponding in common to the first through the fourth banks #0 through #3 of the SDRAM 10, and an ECC controller 6 connected between the control logic 209 and the ECC-CODEC circuit 7 for controlling the ECC-CODEC circuit 7 under control of the control logic 209.

The control logic 209 comprises an input buffer circuit (COMMAND DECODE) 8 responsive to an external command as a combination of a CS (chip select) signal, a WE (write enable) signal, a CAS (column address enable) signal, and a RAS (row address enable) signal for decoding the external command, The input buffer circuit (COMMAND DECODE) 8 is also adapted to receive an end signal (READY) and an internal operation command 2 as an internal command and to decode the internal command.

The ECC controller 6 controls the ECC-CODEC circuit 7 under control of the input buffer circuit (COMMAND DECODE) 8 of the control logic 209 to carry out the super self-refresh operation as follows.

Figure 2:
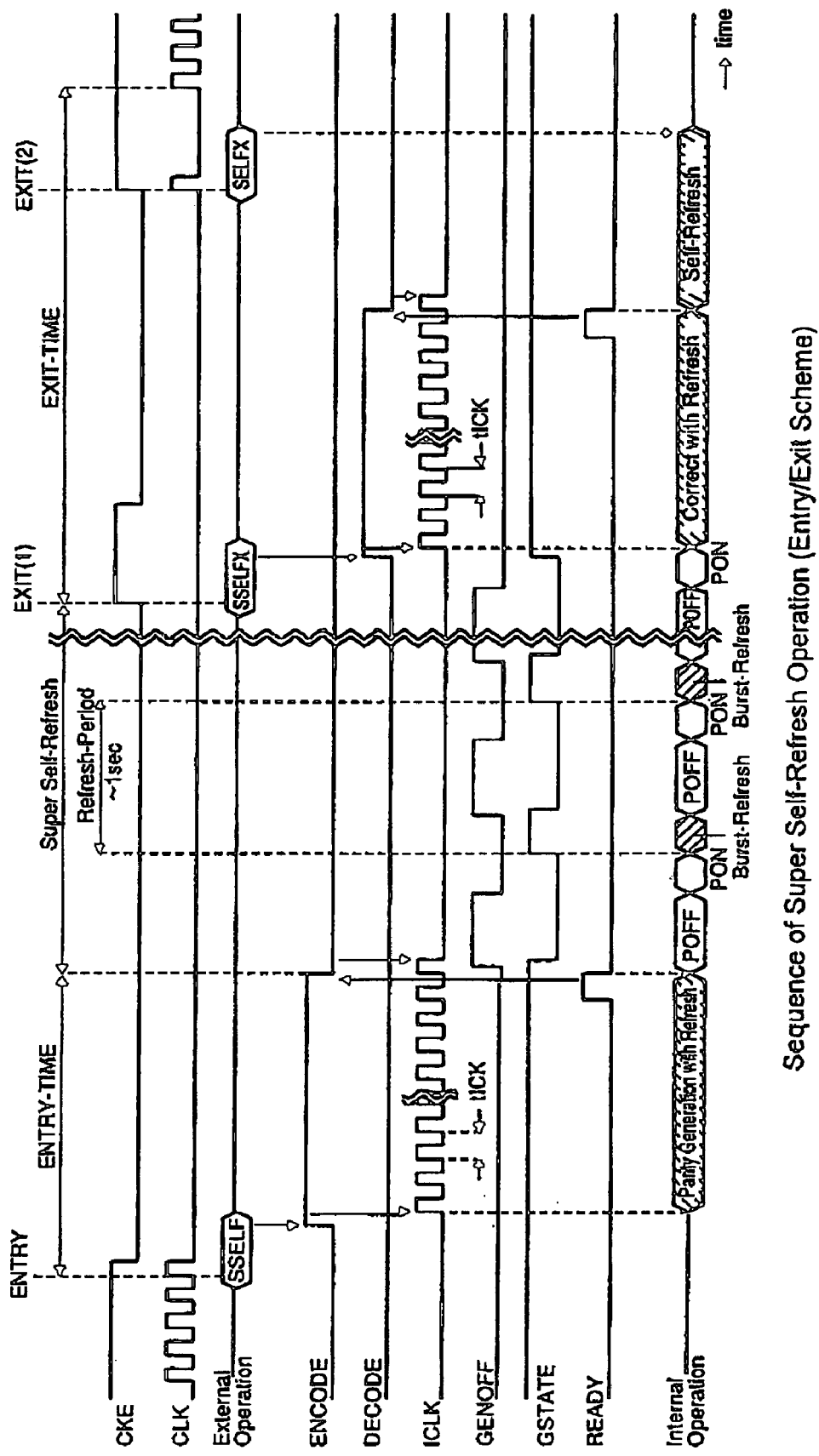
FIG. 2 is a waveform chart for describing a sequence of a super self-refresh operation (entry/exit scheme) of the semiconductor integrated circuit device illustrated in FIG. 1.

Referring to FIG. 2, the super self-refresh operation of the semiconductor integrated circuit device in FIG. 1 will briefly be described.

In the above-mentioned semiconductor integrated circuit device of FIG. 1, the input buffer circuit (COMMAND DECODE) 8 of the control logic (CONTROL LOGIC) 209 of the SDRAM 10 decodes the external command as a combination of the CKE, CS, WE, CAS, and RAS signals. If a super self-refresh entry command (SSELF: see External Operation at a third line in FIG. 2) is obtained as a result of decoding, the input buffer circuit (COMMAND DECODE) 8 delivers a start (START) instruction signal (ENCODE) to the ECC controller 6 as a control signal 1. The start instruction signal (ENCODE) is shown in a fourth line in FIG. 2 as a high-level part. At the time when the input buffer circuit (COMMAND DECODE) 8 obtains the super self-refresh entry command (SSELF), supply of an external clock (CLK: see a second line in FIG. 2) to the SDRAM 10 is stopped. Supplied with the start instruction signal (ENCODE), the ECC controller 6 is supplied with an internal clock (ICLK: see a sixth line in FIG. 2). Supplied with the internal clock (ICLK), the ECC controller 6 delivers an operation mode signal 4 representative of encoding to the ECC-CODEC circuit 7.

Supplied with the operation mode signal 4 representative of the encoding, the ECC-CODEC circuit 7 starts an encoding operation. Specifically, the ECC-CODEC circuit 7 generates parity data (check bits for error detection and correction) with reference to information data stored in each bank of the memory and writes the parity data into a parity memory region (PARITY) of each bank of the memory (Parity Generation with Refresh: see Internal Operation at a tenth line (last line) in FIG. 2).

After completion of generation of the parity data and writing of the parity data into the parity memory region (PARITY) by the ECC-CODEC circuit 7, the ECC controller 6 delivers the end signal (READY: see a ninth line in FIG. 2) as the internal command 2 to the input buffer circuit (COMMAND DECODE) 8.

The input buffer circuit (COMMAND DECODE) 8 receives and decodes the end signal (READY) as the internal command 2 and then stops supply of the start instruction signal (ENCODE: the fourth line in FIG. 2) to the ECC controller 6. The supply of the internal clock (ICLK: the sixth line in FIG. 2) to the ECC controller 6 is also stopped.

When the input buffer circuit (COMMAND DECODE) 8 receives and decodes the end signal (READY) as the internal command 2, a self-refresh control circuit 9 of the control logic (CONTROL LOGIC) 209 of the SDRAM 10 starts the super self-refresh operation (super self-refresh) depicted at an uppermost part in FIG. 2. The super self-refresh operation is carried out by turning off an internal power supply (POFF: see Internal Operation at the last line in FIG. 2), maintaining a long-time suspension state (for example, 10 seconds), turning on the internal power supply (PON: see Internal Operation at the last line in FIG. 2), carrying out normal refresh (Burst-Refresh: see Internal Operation at the last line in FIG. 2: for all cells in a burst fashion, without error correction based on the parity data), and repeating POFF, PON, and Burst-Refresh a desired number of times.

Thereafter, the input buffer circuit (COMMAND BUFFER) 8 of the control logic (CONTROL LOGIC) 209 of the SDRAM 10 decodes the external command as a combination of CKE, CS, WE, CAS, and RAS signals. If a super self-refresh exit command (SSELFX: see External Operation at the third line in FIG. 2) is obtained as a result of decoding, the input buffer circuit (COMMAND BUFFER) 8 delivers a stop (STOP) instruction signal (DECODE) to the ECC controller 6 as the control signal 1. The stop instruction signal (DECODE) is shown in a fifth line in FIG. 2 as a high-level part. When the stop instruction signal (DECODE) is supplied, the ECC controller 6 is supplied with the internal clock (ICLK: the sixth line in FIG. 2). Supplied with the internal clock (ICLK), the ECC controller 6 delivers the operation mode signal 4 representative of decoding to the ECC-CODEC circuit 7.

Supplied with the operation mode signal 4 representative of the decoding, the ECC-CODEC circuit 7 starts a decoding operation. Specifically, the ECC-CODEC circuit 7 reads the parity data and, with reference to the parity data and the information data stored in the memory, corrects an error in the information data and rewrites corrected information data (Correct with Refresh: see Internal Operation at the last line in FIG. 2). The error correction and the rewriting are carried out for all cells in a memory region.

After completion of the error correction and the rewriting by the ECC-CODEC circuit 7, the ECC controller 6 delivers the end signal (READY) as the internal command 2 to the input buffer circuit (COMMAND DECODE) 8.

When the end signal (READY) is received and decoded as the internal command 2, the input buffer circuit (COMMAND DECODE) 8 stops supply of the stop instruction signal (DECODE: the fifth line in FIG. 2) to the ECC controller 6. Supply of the internal clock (ICLK: the sixth line in FIG. 2) to the ECC controller 6 is also stopped.

Thus, the semiconductor integrated circuit device exits from the super self-refresh mode and returns to a normal operation (in the illustrated example, a normal self-refresh operation). The normal self-refresh operation is also finished in response to an external self-refresh exit command (SELFX: see External Operation at the third line in FIG. 2).

Thus, the semiconductor integrated circuit device enters into an entry time (ENTRY-TIME depicted at the uppermost part in FIG. 2) when the super self-refresh entry command (SSELF) is supplied from the outside. In the entry time, reading of all bits of the information data is executed and parity bits are generated and written. Subsequently, the semiconductor integrated circuit device proceeds to the super self-refresh (long-cycle self-refresh) depicted at the uppermost part in FIG. 2. The refresh is carried out in a long cycle beyond the capacity of the normal refresh and errors possibly generated are left.

When the super self-refresh exit command (SSELFX) is supplied from the outside, the semiconductor integrated circuit device enters an exit time (EXIT-TIME depicted at the upper most part in FIG. 2). In the exit time, all bits of the information data are read and erroneous data generated during the long-cycle refresh are corrected by the use of the parity bits and corrected data are rewritten.

Referring to FIG. 1, the semiconductor integrated circuit device has a structure in which the ECC controller 6 and the ECC-CODEC circuit (comprising a coder circuit for generating parity bits from original memory data and a decoder circuit for generating error-corrected memory data from the parity bits and readout data from the memory) 7 are simply added to the SDRAM 10 in order to perform the super self-refresh operation. Thus, the SDRAM 10 is not substantially changed in its circuit structure. The ECC controller 6 independently produces the internal command 2 and an internal address 3 to be supplied to the SDRAM 10. The input buffer circuit (COMMAND DECODE) 8 not only receives the external command (external instruction) but also the internal command (internal instruction). The ECC controller 6 produces the CODEC operation mode signal 4 as a control instruction to the ECC-CODEC circuit 7 and receives error detection (ERROR) and error location detection (LOCATION) signals 5 from the ECC-CODEC circuit 7 to efficiently execute parity bit generation/writing and error correction.

Figure 3:
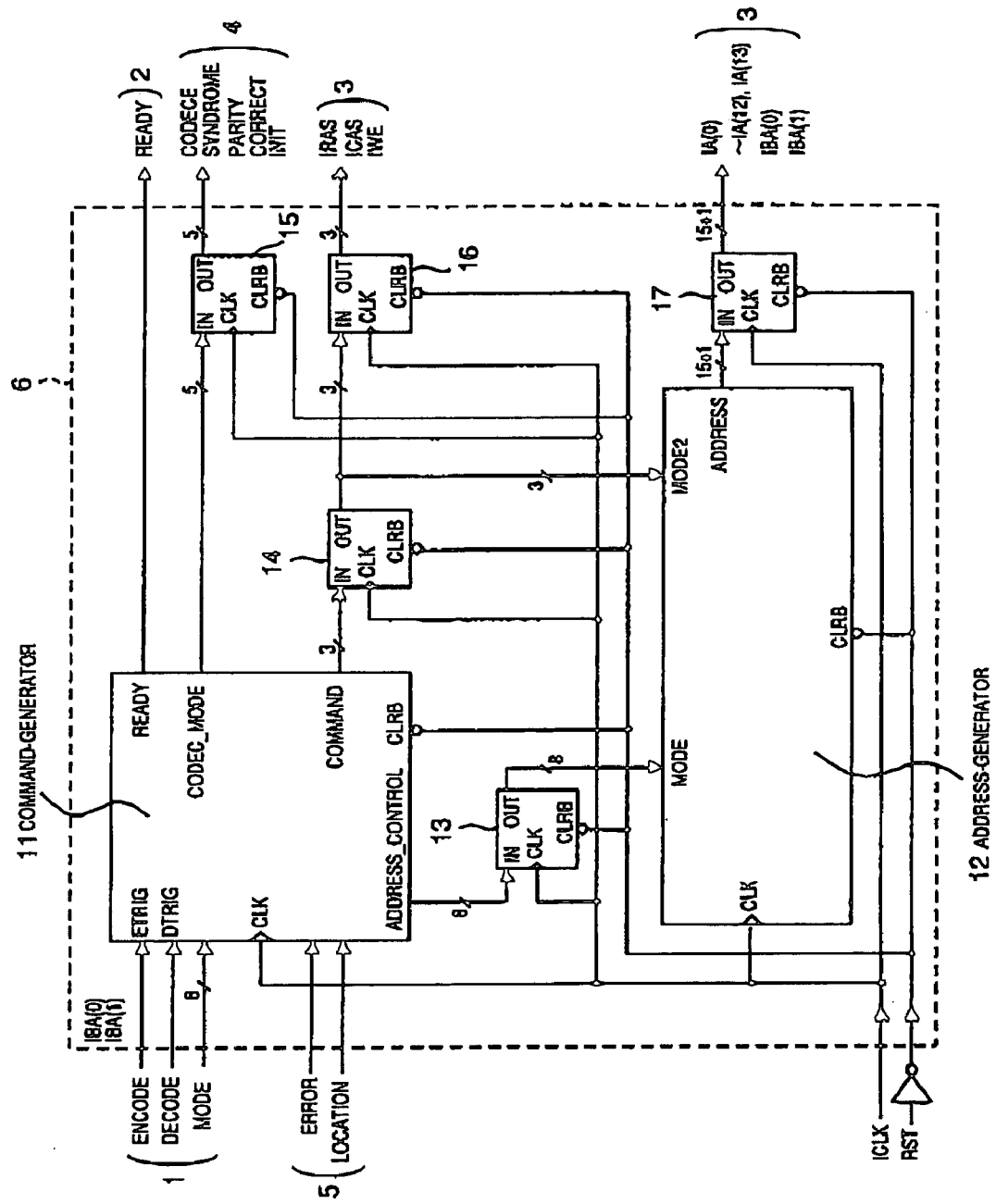
FIG. 3 is a block diagram of an ECC controller of the semiconductor integrated circuit device illustrated in FIG. 1.

Referring to FIG. 3, the ECC controller 6 comprises a command generator 11, an address generator 12, and a plurality of register circuits 13 through 17. Each of the command generator 11 and the address generator 12 is a single-phase synchronization circuit. Supplied with the control signal (ENCODE=start instruction signal, DECODE=stop instruction signal, MODE=operation mode indication signal) 1 produced by the control logic (CONTROL LOGIC) 209 (FIG. 1) in the SDRAM (FIG. 1) and the control signal (ERROR and LOCATION=the signals used upon error correction to inform occurrence of an error and its location) 5, the ECC controller 6 determines the CODEC operation mode signal 4 and generates the internal command 2 and the internal address 3. Some of the signals are delivered through the register circuits 14 to 17 to the outside of the ECC controller 6. Each of the register circuits 13 through 17 has an input terminal IN, and output terminal OUT, a terminal CLK supplied with the internal clock (ICLK), and a terminal CLRB supplied with a reset signal RST.

Figure 4A:
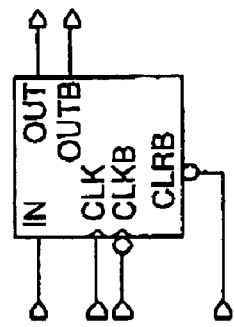
FIG. 4A shows a FF (flip-flop) circuit used as each register circuit of the ECC controller illustrated in FIG. 3.
Figure 4B:
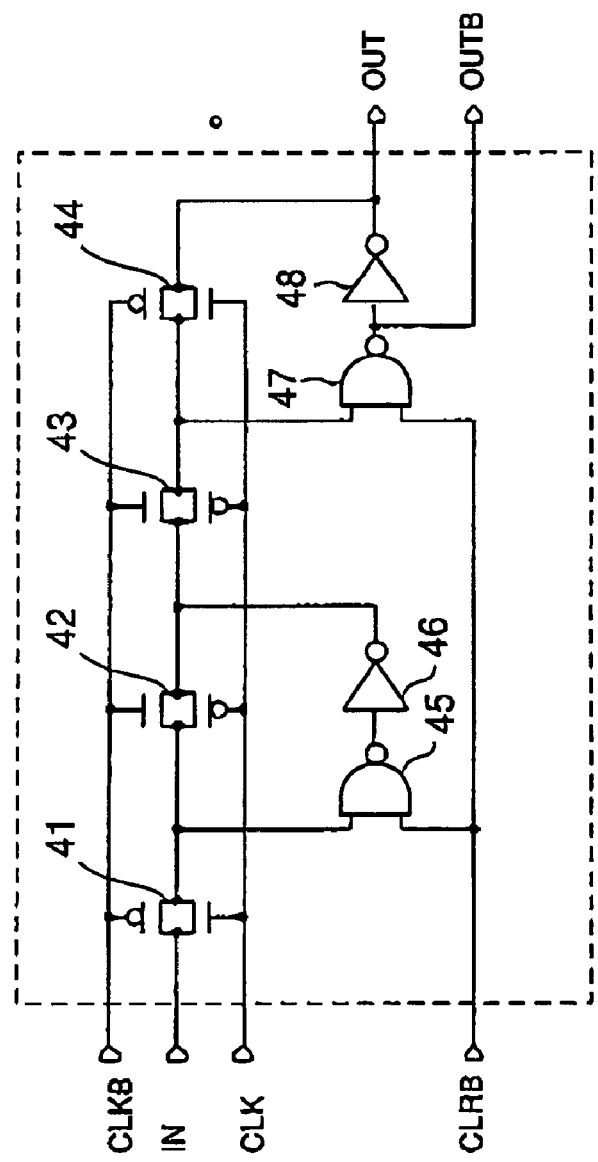
FIG. 4B shows an internal structure of the FF circuit illustrated in FIG. 4A.

Referring to FIGS. 4A and 4B, a FF (flip-flop) circuit used as each of the register circuits 13 through 17 comprises a switch 41 supplied with a signal at the Input-terminal IN and controlled by the clocks CLK and CLKB, a switch 42 supplied with an output signal of the switch 41 and controlled by the clocks CLK and CLKB, a switch 43 supplied with an output signal of the switch 42 and controlled by the clocks CLK and CLKB, and a switch 44 supplied with an output signal of the switch 43 and controlled by the clocks CLK and CLKB. An output signal of the switch 44 is delivered to the output terminal OUT. The FF circuit further comprises a NAND gate 45 supplied with the output signal of the switch 41 and a signal at the terminal CLRB, an inverter 46 for inverting an output signal of the NAND gate 45 and delivering an inverted signal to the switch 43 as an input signal, a NAND gate 47 supplied with the output signal of the switch 43 and the signal at the terminal CLRB, and an inverter 48 for inverting an output signal of the NAND gate 47 and delivering an inverted signal to the output terminal OUT. An output signal of the NAND gate 47 is delivered to an output terminal OUTB.

Figure 5:
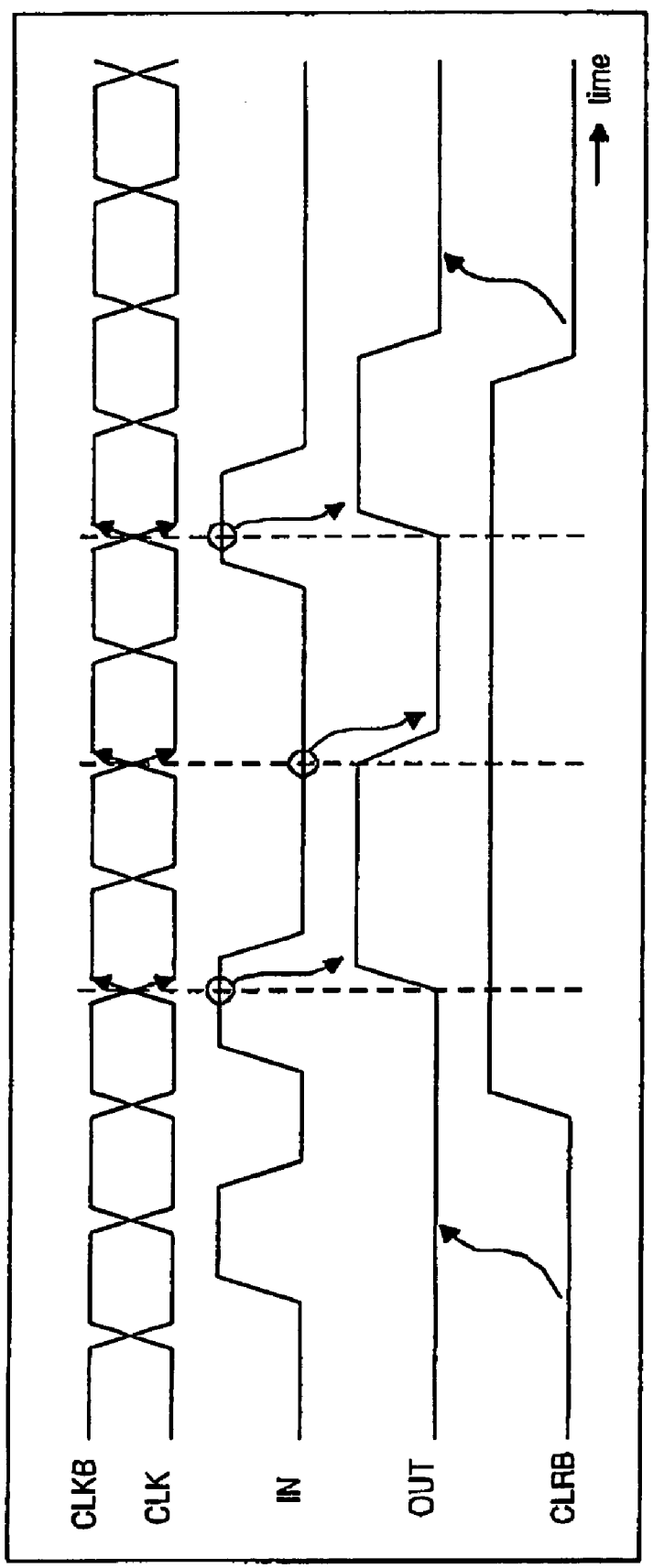
FIG. 5 is a waveform chart for describing an operation of the FF circuit illustrated in FIGS. 4A and 4B.

In FIGS. 4A and 4B, the terminal CLKB is supplied with a clock obtained by inverting the clock at the terminal CLK, as is obvious from FIG. 5. FIG. 5 shows an example of operation of the FF circuit.

Turning back to FIG. 3, the ECC controller 6 delivers, among the output signals, the end signal (READY) to the control logic (CONTROL LOGIC) 209 (FIG. 1) in the SDRAM 10 (FIG. 1). The end signal (READY) is produced at the time of completion of generation and writing of the parity data (Parity Generation with Refresh: the last line in FIG. 2) and at the time of completion of error correction of the information data with reference to the parity data and rewriting of the corrected information data (Correct with Refresh: the last line in FIG. 2).

Among the output signals of the ECC controller 6, each of CODECE (CODEC enable), SYNDROME, PARITY, CORRECT, and INIT is used in the ECC-CODEC circuit 7 as the CODEC operation mode signal 4 to determine various operations associated with ECC (for example, activation of the CODEC or a memory circuit, generation and writing of the parity data, and generation and writing of the error-corrected data).

IRAS, ICAS, and IWE are control signals for controlling an internal memory and correspond to RAS, CAS, and WE in the SDRAM 10, respectively. In FIG. 3, IA(0) to IA(12), and IA(13) correspond to internal row/column addresses (multiplexed signal) and IBA(0) and IBA(1) correspond to bank addresses. FIG. 3 shows an example applicable to a 256-Mb SDRAM which will later be described in conjunction with FIGS. 17 and 18 and including more parity bits added in a row direction. IA(13) is a row address signal added for parity bit selection (not present as an external address signal).

The ECC controller 6 in FIG. 3 will be described more in detail.

Referring to FIG. 3, the ECC controller 6 comprises the command generator 11, the address generator 12, and the output register circuit (flip-flop circuits) 13 to 17 as described above and serves to operate the SDRAM 10 (FIG. 1) and the ECC-CODEC circuit (coder/decoder circuit) 7 (FIG. 1) from the inside so as to carry out parity generation (Parity-Generation) and correcting operation (Correct) (see FIG. 2).

As described in the above-mentioned publication, the super self-refresh mode is operable by the external command. In this invention, a circuit called the ECC controller 6 is provided and the SDRAM 10 is operated by the internal operation in a self-complete fashion. The user is simply required to control the entry/exit commands (SSELF and SSELFX in FIG. 2). Thus, the load upon the user is lessened.

Each of the command generator 11 and the address generator 12 is a single-phase synchronization sequence circuit comprising a combinational circuit of NANDs and NORs and flip-flop circuits and can be designed by a logic synthesis tool (existing or simple).

The output signals of the command generator 11 and the address generator 12 are delivered through the output register circuits 14 to 17 to the ECC-CODEC circuit 7 and the input buffer circuit (COMMAND DECODE) 8 of the control logic 209 of the SDRAM 10 so as to minimize a delay time from the internal synchronization clock signal (ICLK) and to achieve a synchronizing operation with a sufficient operation margin reserved. Similar data exchange through the register circuits is also carried out besides the above.

The error detection signals (ERROR and LOCATION) 5 returned from the ECC-CODEC circuit 7 to the command generator 11 is transmitted through an output register circuit (78 in FIG. 22 which will later be described). A MA (main amplifier) output signal (output data) is first buffered in an output register (DATA OUTPUT REGISTER: see FIG. 1 and FIGS. 17 and 18 which will later be described) and then delivered from a data output buffer circuit (DQ) to the outside. Likewise, the output data (MA output signal) supplied to the ECC-CODEC circuit 7 is first buffered in an output register circuit (depicted by "FF" in FIG. 30 which will later be described). On the contrary, input data from a data input buffer circuit (DQ) are first buffered in an input register (DATA INPUT REGISTER: see FIG. 1 and FIGS. 17 and 18 which will later be described) and then sent to a WB (write buffer). Likewise, the parity bits produced from the ECC-CODEC circuit 7 may be first buffered in the output register circuit and then sent to the WB to be written into memory cells. Strictly, whether the register is required or not depends upon an operation speed of the clock and the register is unnecessary in case of a low speed. No register is provided in FIGS. 30 and 31 which will later be described.

As will be described in the following, the meaning of inclusion of the register is somewhat different depending upon the circuit.

Each of the command generator 11 and the address generator 12 is a large-scale sequence circuit. Therefore, a hazard often occurs in output signals from the command generator 11 and the address generator 12 to cause malfunction. In addition, an output delay time is significantly different depending upon an operation timing. In order to eliminate such factors causing reduction in operation margin, the output register circuit is inserted.

The ECC-CODEC circuit 7 is disposed apart from the ECC controller 6 and a delay time produced in its output, i.e., the error detection signals (ERROR and LOCATION) is not negligible. The error detection/correction triggers an interrupting operation such as stop of generation of the internal command and error correction/writing operations and, therefore, the delay time must be minimized (must be within one clock). In case where the output register circuit is not inserted, the syndrome calculation time in the ECC-CODEC circuit 7 seems as the delay time so that the synchronization with the ECC controller 6 is difficult. Thus, the output register circuit is inserted in order to minimize the delay of the error detection signals by buffering the error detection signals in the register circuit.

The input/output register circuits DQ are provided so as to be adapted to CAS latency and a burst operation (this is an existing structure). This also applies to the register circuit between the ECC-CODEC circuit 7 and MA/WB.

Now, input/output signals of the ECC controller 6 in FIG. 3 will be described.

ENCODE . . . Parity generation start/stop signal. Input signal ETRIG of the command generator.

When this signal is turned HIGH as illustrated in FIG. 2, the parity generation is started in synchronization with the internal synchronization clock (ICLK). When this signal is turned LOW, the ECC controller resets (initializes) itself and stops operation.

DECODE . . . Correcting operation start/stop signal. Input signal DTRIG of the command generator.

When this signal is turned HIGH as illustrated in FIG. 2, the correcting operation is started in synchronization with the internal synchronization clock (ICLK). When this signal is turned LOW, the ECC controller resets (initializes) itself and stops operation.

MODE . . . Operation mode signal of the ECC controller. For example, following signals are used.

4B, 2B, 1B, HB, QB . . . used in a PASR (Partial Array Self-Refresh) mode to change a coding region (access region)

4B: For 4 banks (all bits). Default state.

2B: For 2 banks including Bank0 and Bank1.

1B: For 1 bank of Bank0.

HB: For a half (lower bits of X address) of Bank0.

QB: For a quarter (lower bits of X address) of Bank0.

The PASR mode is a mode in which a self-refresh region is restricted and a data holding current is reduced.

SSROP: To change the internal operation between four-bank simultaneous operation and one-by-one operation for one bank at a time. In the structure in FIG. 1 (also in the structure of FIG. 17 which will later be described), the ECC-CODEC circuit is arranged for each IO line. Therefore, no more than the one-by-one operation can be selected. On the other hand, in case of FIG. 18 which will later be described, the ECC-CODEC circuit is arranged for each MA/WB of each bank and the four-bank simultaneous operation can be selected. The four-bank simultaneous operation requires large current consumption but can shorten the coding/decoding time to ¼.

CODE1, CODE2: In case of a product code by two codes, only one of the codes is operated. In default, both codes are operated. In a probing test, a correcting ability is decreased by operation of either one so that omission of correction can efficiently be relieved in a redundant manner.

ERROR . . . Error detection signal. If an error is present and absent after syndrome calculation at the ECC-CODEC circuit, the signal is HIGH and LOW, respectively.

In case of ERROR=HIGH (occurrence of error), operation proceeds to the error location detection.

LOCATION . . . Error location detection signal. If the error location is detected in the error location detection, this signal is turned HIGH and correction/writing operations are carried out.

ICK . . . Internal synchronization clock signal. The parity generation/correcting operation are entirely carried out with reference to this clock.

RST . . . Reset signal. When the power supply is turned on or at the start-up by input of an<MRS (Mode Register Set)> command, a pulse signal is sent to all chips.

READY . . . A pulse signal is produced upon completion of the parity generation/correcting operation, as illustrated in FIG. 2.

CODECE, SYNDROME, PARITY, CORRECT, INIT . . . Operation mode signals of the ECC-CODEC circuit (see FIG. 6 in addition).

In accordance with each operation timing of the parity generation/correcting operation, the operation mode is switched.

CODECE: When this signal is HIGH, CCLK/CCLK2 are produced on the basis of the ICLK and supplied to the ECC-CODEC circuit. Thus, when this signal is HIGH, the ECC-CODEC circuit can perform a cyclic or circular shift operation (see FIG. 25 which will later be described).

SYNDROME: When this signal is HIGH, it is possible to fetch output bits from the MA one by one and to carry out syndrome calculation and parity-bit calculation (the shift register carries out forward cyclic shift).

PARITY: When this signal is HIGH, calculated parity bits (bits of the respective shift registers) can successively or sequentially be delivered to the WB one by one. At this time, the shift registers are successively reset (the shift register carries out forward cyclic shift).

CORRECT: When this signal is HIGH, backward cyclic shift (error location detection) can be carried out only by the shift registers without carrying but data input/output from/to the outside at all.

INIT: When this signal is HIGH, the shift registers are cyclically shifted and reset.

IRAS, ICAS, IWE . . . Internal command signals. Similar in specification to the external command. In the internal operation, CS is unnecessary.

A command corresponding to the timing of the parity generation/correcting operation is produced.

IA(0)–IA(12), IA(13), BA(0), BA(1) . . . Internal addresses and internal bank addresses.

An address corresponding to the timing of the parity generation/correcting operation is produced.

Figure 6:
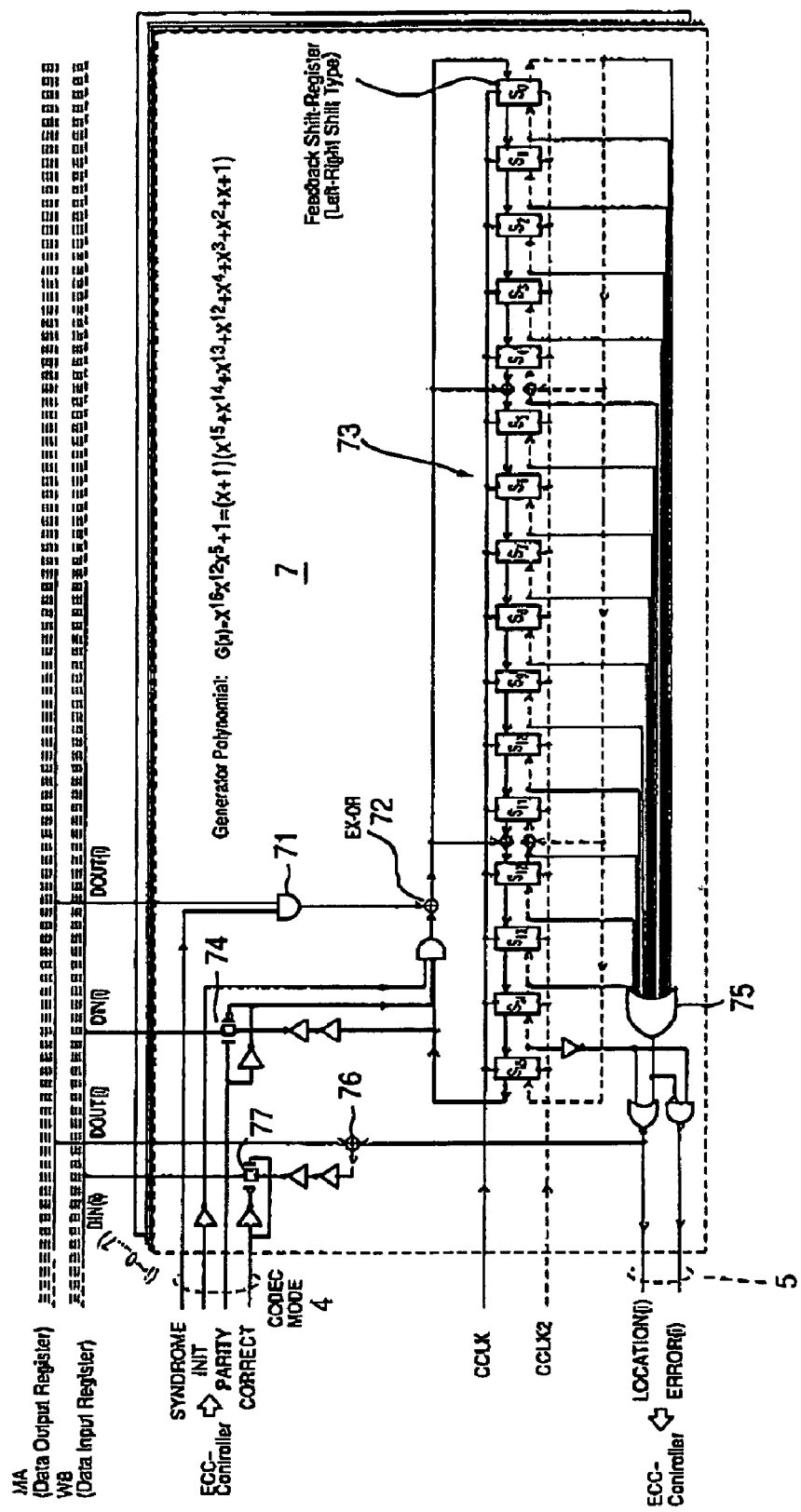
FIG. 6 is a block diagram of an ECC-CODEC circuit of the semiconductor integrated circuit device illustrated in FIG. 1.

Referring to FIG. 6, the ECC-CODEC circuit 7 used in the semiconductor integrated circuit device in FIG. 1 comprises a combination of a coder circuit and a decoder circuit.

In case where the ECC-CODEC circuit 7 is operated as the coder circuit, readout data (i.e., original memory data) are sent from the main amplifier MA (or the data output register storing the readout data from the memory) through an AND gate 71 controlled by the SYNDROME signal and an EX-OR (Exclusive OR) circuit 72 to be supplied to a circulating circuit 73 comprising a plurality of feedback shift registers (FSR) S0 to S15 of a left/right shift type and EX-OR circuits. After subjected to logical operation, the readout data are sent through a switch 74 controlled by a parity (PARITY) signal to be delivered as the parity data to the write buffer WB (or the data input register) and written into the memory or a parity data accumulating section as write data.

Figure 7:
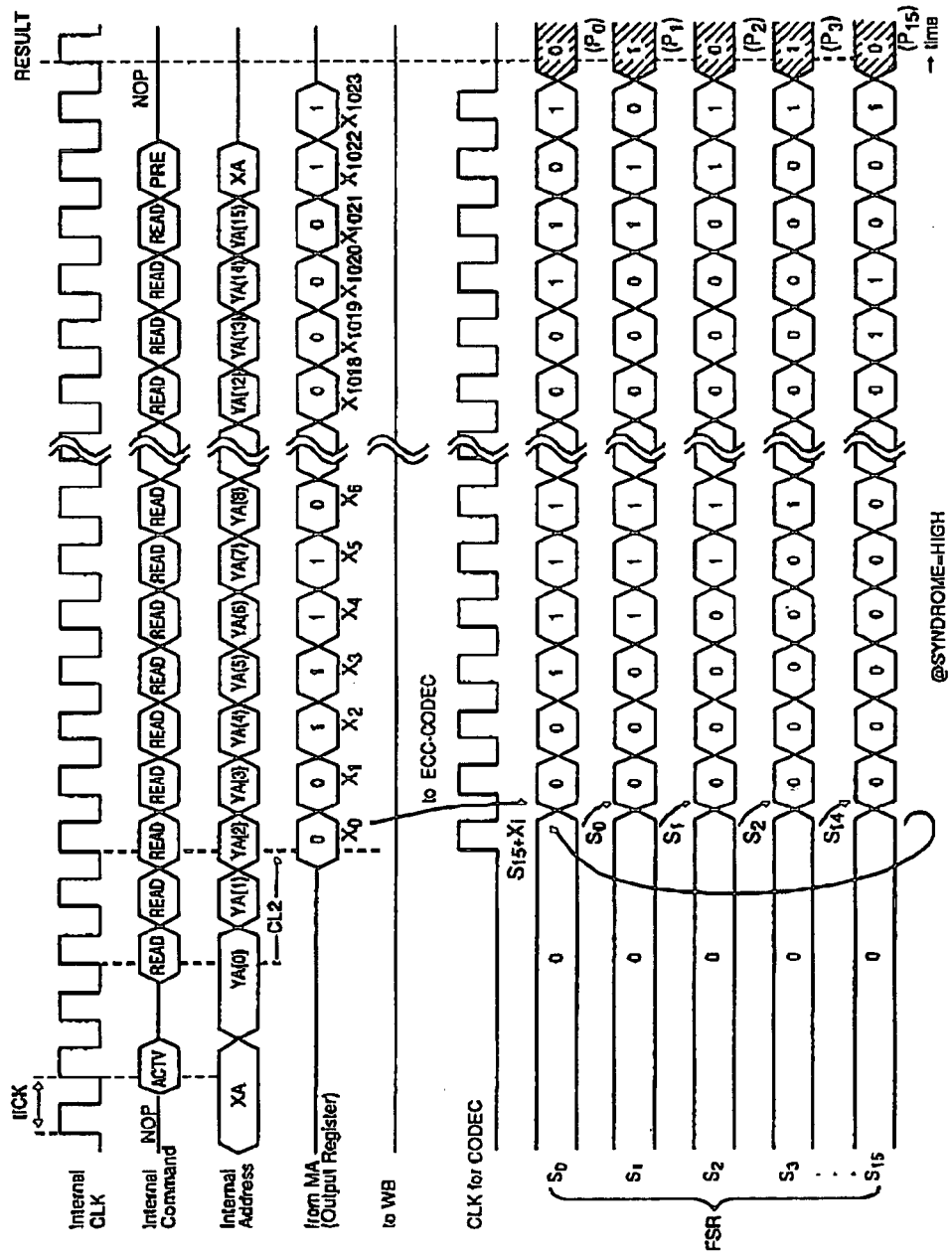
FIG. 7 is a view for describing parity-generation (1) (parity bit calculation) in an example 1 of a super self-refresh internal operation carried out in the ECC-CODEC circuit illustrated in FIG. 6.
Figure 8:
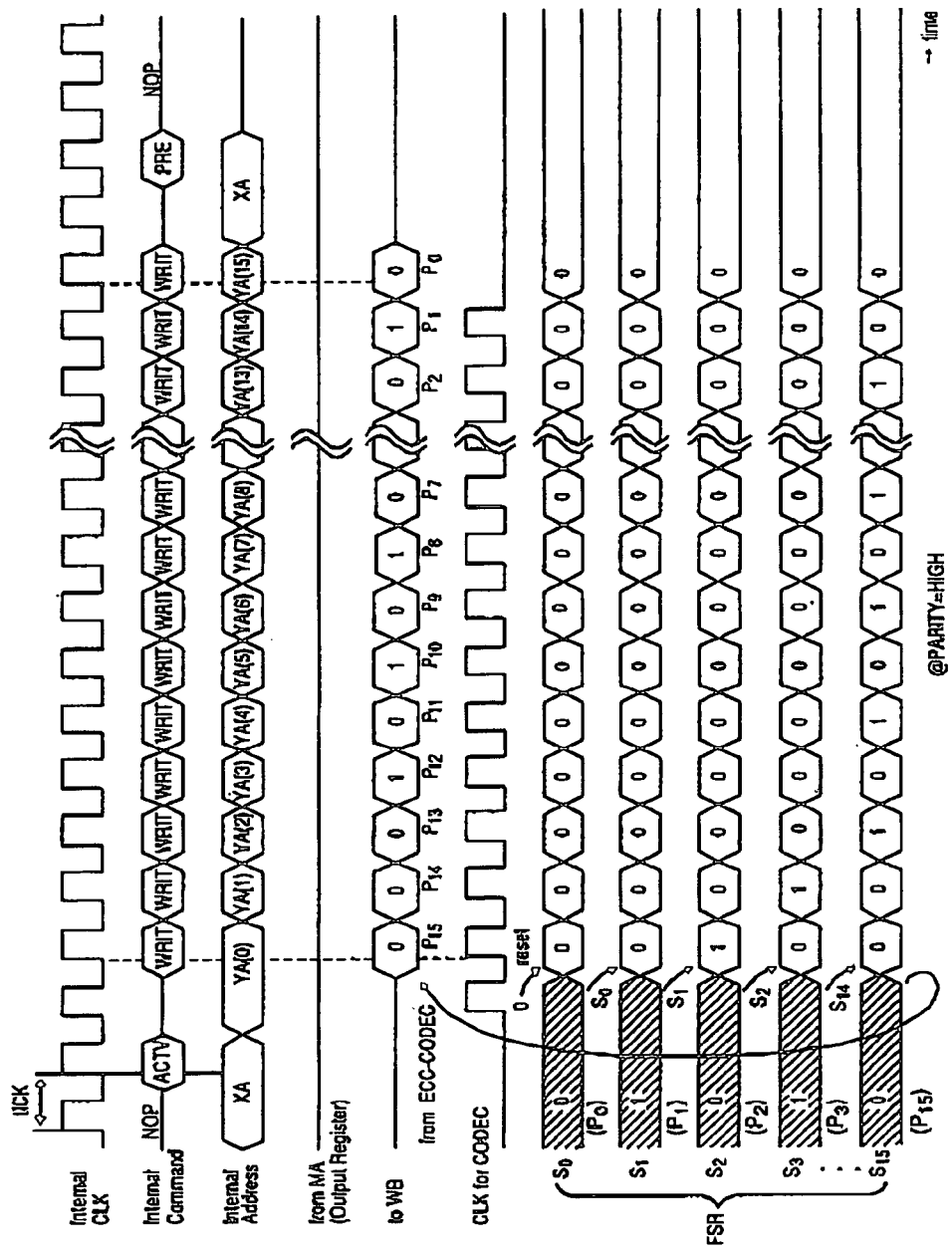
FIG. 8 is a view for describing parity-generation (2) (parity bit writing) in the example 1 of the super self-refresh internal operation carried out in the ECC-CODEC circuit illustrated in FIG. 6.

FIGS. 7 and 8 show an example 1 of the super self-refresh internal operation carried out by the ECC-CODEC circuit 7 in FIG. 6. FIG. 7 shows the parity generation (1) (parity bit calculation) in the example 1 of the super self-refresh internal operation while FIG. 8 shows the parity generation (2) (parity bit writing) in the example 1 of the super self-refresh internal operation. In synchronization with the internal clock (Internal CLK) within the device, commands of memory activation (ACTV) and reading operation (READ) are executed. Simultaneously, a row address (XA) and a column address (YA) are acquired. With reference to the addresses, Column (column address) is incremented and memory data of 1024 bits are read and taken into the main amplifier MA as read data. In addition, the read data are taken into the shift registers (S0–S15) of the circulating circuit 73 in FIG. 6 and subjected to calculation to produce the parity data based on the original memory data. In a following cycle, the parity data are delivered to the write buffer WB bit by bit. At this time, in synchronization with the internal clock (Internal CLK) within the device, commands of memory activation (ACTV) and writing operation (WRIT) are executed. Simultaneously, the row address (XA) and the column address (YA) corresponding to the parity bit region are acquired. Based on these addresses, Column (column address) is incremented and 16 parity bits are written into the memory cells (corresponding to Hamming codes [1040, 1024] although not described in detail).

In FIG. 6, the readout data are taken into the shift registers (S0–S15) of the circulating circuit 73. After subjected to calculation, the parity data based on the original memory data are produced and delivered to the write buffer WB.

In case where the ECC-CODEC circuit 7 is operated as the decoder circuit, the parity data are similarly sent from the main amplifier MA through the AND-gate 71 controlled by the SYNDROME-signal and the EX-OR circuit 72 to be supplied to the circulating circuit 73 comprising the shift registers (S0 to S15) and the EX-OR circuits. The parity data are shifted in a backward direction and subjected to logical operation. From an output of an OR circuit 75 for calculating an OR logic of outputs of the shift registers (S0–S14) and an output of the final-stage shift register (S15), information of a location (LOCATION) where a defect of the memory data occurs is produced. An EX-OR circuit 76 calculates an EX-OR logic of the location (LOCATION) information and the readout memory data on the main amplifier MA to produce defect-corrected data. The error-corrected data are sent through a switch 77 controlled by a CORRECT signal to be delivered to the write buffer WB as error-corrected data.

Figure 9:
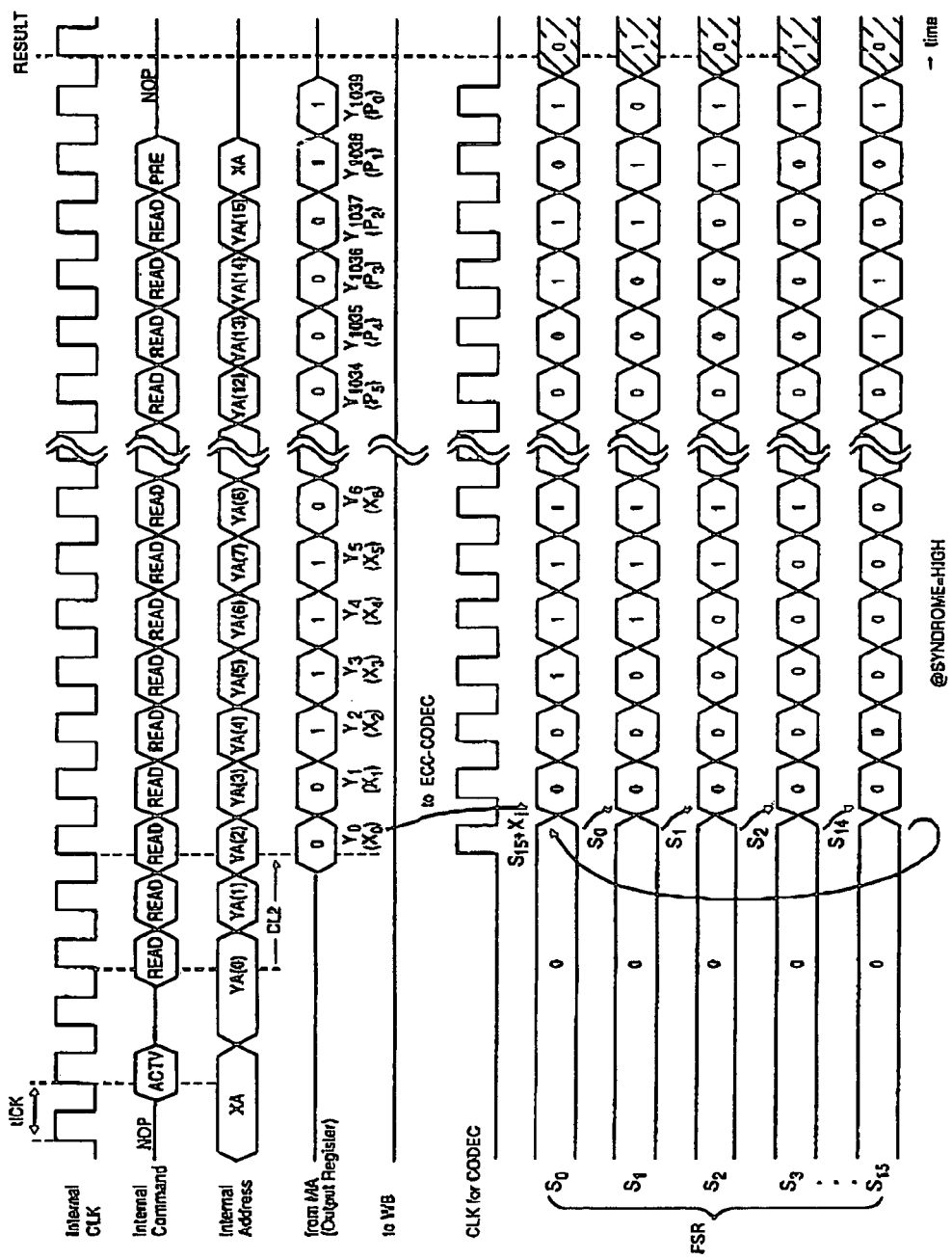
FIG. 9 is a view for describing a correcting operation (Correct) (1) (syndrome calculation) in an example 2 of the super self-refresh internal operation carried out in the ECC-CODEC circuit illustrated in FIG. 6.
Figure 10:
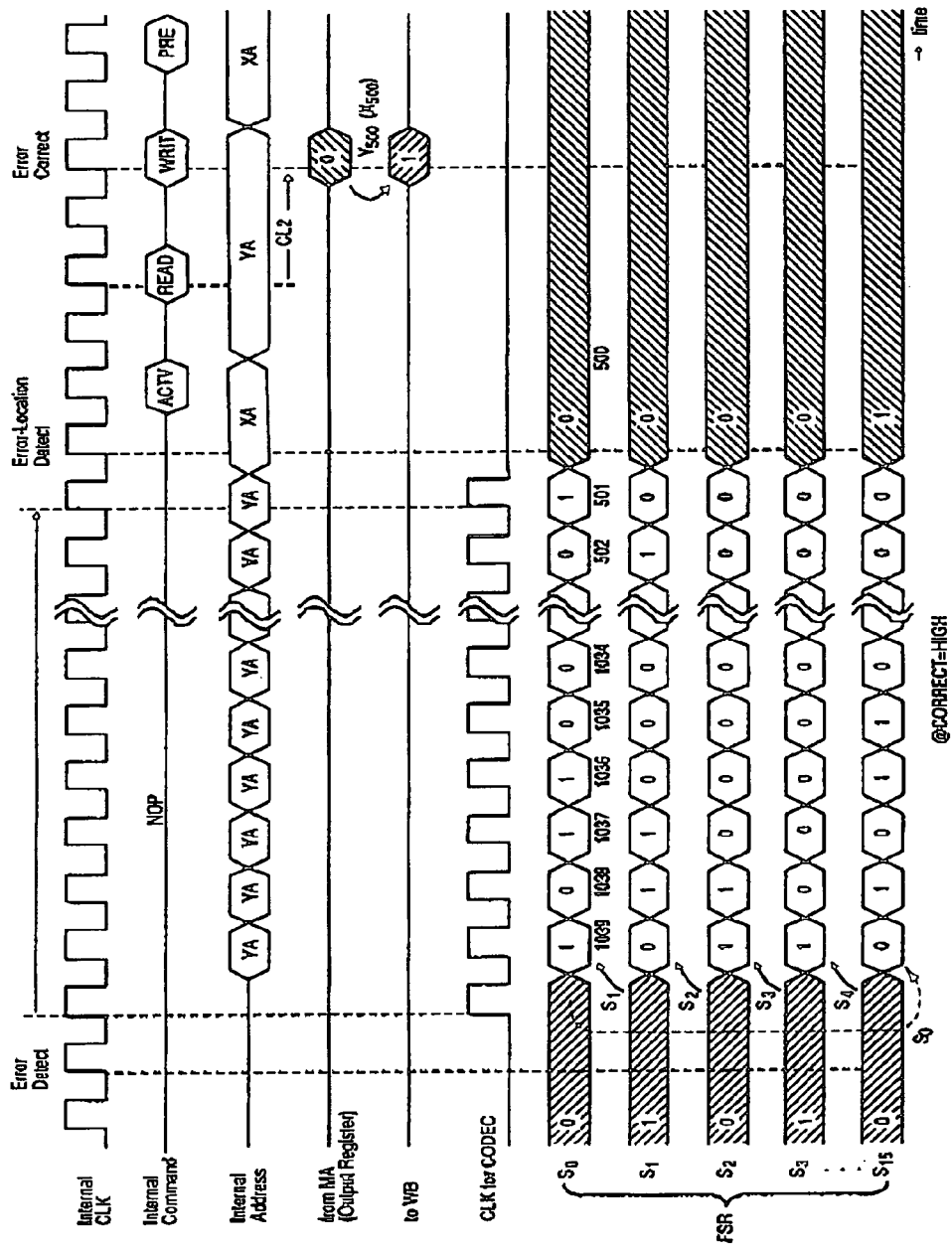
FIG. 10 is a view for describing a correcting operation (Correct) (2) (detection of error location and writing of correct data) in the example 2 of the super self-refresh internal operation carried out in the ECC-CODEC circuit illustrated in FIG. 6.

FIGS. 9 and 10 shows an example 2 of the super self-refresh internal operation carried out by the ECC-CODEC circuit 7 in FIG. 6. FIG. 9 shows the correcting operation (Correct) (1) (syndrome calculation) in the example 2 of the super self-refresh internal operation while FIG. 10 shows the correcting operation (Correct) (2) (error location detection and correction/writing) in the example 2 of the super self-refresh internal operation. In synchronization with the internal clock (Internal CLK) within the device, the original memory data and the parity data are read in the manner described in conjunction with FIGS. 7 and 8. The circulating circuit 73 in FIG. 6 carries out backward shift and logical operation to detect a defective address. With reference to the defective address, commands of memory activation (ACT) and reading operation (READ) are executed in synchronization with the internal clock (Internal CLK) within the device. The readout data appearing on the main amplifier MA are erroneous information. Therefore, the readout data are inverted and delivered to the write buffer WB. Simultaneously, a write command (WRIT) is produced and corrected data are written into a corresponding address of the memory. Subsequently, the similar operation is repeated and correction of the error data is carried out for all bits.

Herein, referring to FIGS. 2, 7 and 8, the super self-refresh mode/parity generation will be described more in detail.

(1) After entry into the super self-refresh mode, the input buffer circuit (COMMAND DECODE) 8 of the control logic 209 of the SDRAM 10 sets the ENCODE signal at HIGH. Simultaneously, an oscillating operation of the internal synchronization clock signal ICLK is started (at a stage of start-up of the SDRAM 10, the flip-flop circuit in the ECC controller 6 is initialized).

(2) The ECC controller 6 is supplied with the ENCODE signal and starts the internal operation of the parity generation (encoding). Hereinafter, a (1040, 1024) code (1024 information bits and 16 parity bits) will be described by way of example.

(3) After the INIT signal is turned HIGH (CODEC initialization mode), the CODECE (CODEC enable) signal is turned HIGH for 16 cycles and the shift registers (S0–S15) in the ECC-CODEC circuit 7 are initialized (see FIG. 6). After completion, the CODEC mode signal is returned LOW.

(4) After the SYNDROME signal is turned HIGH (CODEC syndrome mode), issuance of the internal operation commands <ACTIVE> <READ>. . . <PRE> is repeated as shown in FIGS. 7 and 8. While X scanning is performed with the burst length of 16 or 32, READ operation of 1024 bits is carried out. At this time, the CODECE signal is turned HIGH in synchronization with the output timing of the readout data. The shift registers are circularly shifted and the data of 1024 bits are successively taken into the CODEC bit by bit. Thus, the parity bits are calculated for the 1024 information bits and the result of calculation is retained in the shift registers of 16 bits as the parity bits of 16 bits. After completion, the CODEC mode signal is returned LOW.

(5) After the PARITY signal is turned HIGH (CODEC parity mode), issuance of the internal operation commands <ACTV> <WRITE>. . . <PRE> is carried out and writing into the memory cells is carried out with the burst length of 16. At this-time, the CODECE signal is turned HIGH in synchronization with the output timing of the write data. While the shift registers are circularly shifted, the data of 16 bits are successively produced from the CODEC bit by bit. Simultaneously, the shift registers are successively reset (the circuit structure without requiring initialization).

(6) The syndrome mode (4) and the parity mode (5) are repeated until the parity bits are produced for all bits.

(7) After completion of parity bit generation for all bits, the READY signal (1 clock pulse) is produced and the operation of the ECC controller 7 is completed. Supplied with the READY signal, the input buffer circuit (COMMAND DECODE) 8 of the control logic 209 of the SDRAM 10 turns the ENCODE signal LOW to start long-cycle self-refresh control.

Referring to FIGS. 2, 9, and 10, the super self-refresh mode/correcting operation will be described more in detail.

(1) Supplied with the super self-refresh exit command (SSELFX), the input buffer circuit (COMMAND DECODE) 8 of the control logic 209 of the SDRAM 10 sets the DECODE signal at HIGH. Simultaneously, the oscillating operation of the internal synchronization clock signal ICLK is started.

(2) Supplied with the DECODE signal, the ECC controller 6 starts the internal operation of correcting (decoding). Hereinafter, a (1040, 1024) code (1024information bits and 16 parity bits) will be described by way of example.

(3) After the INIT signal is turned HIGH (CODEC initialization mode), the CODECE (CODEC enable) signal is turned HIGH for 16 cycles and the shift registers (S0-S15) in the ECC-CODEC circuit 7 are initialized (see FIG. 6). After completion, the CODEC mode signal is returned LOW.

(4) After the SYNDROME signal is turned HIGH (CODEC syndrome mode), issuance of the internal operation commands <ACTIVE> <READ>. . . <PRE> is repeated as shown in FIGS. 7 and 8. While X scanning is performed with the burst-length of 16 or 32, READ operation of 1024 information bits and then 16 parity bits is carried out (READ operation of a code word of 1040 bits is carried out). At this time, the CODECE signal is turned HIGH in synchronization with the output timing of the readout data. The shift registers are circularly shifted and the data of 1040 bits are successively taken into the CODEC bit by bit. Thus, the syndrome pattern for the code word is calculated and the result of calculation is retained in the shift registers of 16 bits. After completion, the CODEC mode signal is returned to LOW.

(5) If the syndrome pattern is all zero, it is judged that the code word has no error. In order to perform the syndrome calculation for a next code word, operation proceeds to the above-mentioned operations (3) and (4). If the syndrome pattern is not all zero, it is judged that the code word is erroneous. Then, operation proceeds to the error location detection. As illustrated in FIG. 6, the error detection signal ERROR is turned LOW if the syndrome pattern is all zero and is otherwise HIGH. Presence or absence of error is transmitted to the ECC controller 7.

(6) After the CORRECT signal is turned HIGH (CODEC correction mode), the CODECE signal is turned HIGH without issuing the internal operation commands and (backward) cyclic shift of the shift registers alone is repeatedly carried out, as shown in FIGS. 9 and 10. It is noted here that generation of the internal addresses is executed in the manner reverse to that during the syndrome calculation in correspondence to the (backward) cyclic shift of the shift registers. At this time, the first (backward) cyclic shift corresponds to the syndrome pattern of the first bit (the last-acquired bit). In case where "the uppermost or most significant bit (S15) alone is 1 while the remaining bits are all zero", the bit is judged to be erroneous. Except for the case where "the uppermost or most significant bit (S15) alone is 1 while the remaining bits are all zero", the (backward) cyclic shift is repeated. If an erroneous bit is detected, the CODECE signal is turned LOW and the (backward) cyclic shift is stopped. The internal commands <ACTV> <READ> <WRIT> <PRE> are issued as illustrated in FIGS. 9 and 10 and inversion (correction)/writing is executed.

As illustrated in FIG. 6, in case where "the uppermost or most significant bit (S15) alone is 1 while the remaining bits are all zero", the error location detection signal LOCATION is turned HIGH and is otherwise LOW. If LOCATION is HIGH in the correction mode, inverted data obtained by inverting the readout data are sent to the WB.

After completion of the interrupting operation, the (backward) cyclic shift is again carried out until the last of the code word. When the above-mentioned process is completed for one code word (1040 bits), the CODEC mode signal is returned to LOW and operation proceeds to the above-mentioned operation (3) in order to process a next code word.

(7) The above-mentioned operations (3), (4), (5), and (6) are repeated to execute error correction for all bits. After completion, the READY signal (1 clock pulse) is produced and the operation of the ECC controller 7 is finished. Supplied with the READY signal, the input buffer circuit (COMMAND DECODE) 8 of the control logic 209 of the SDRAM 10 turns the DECODE signal LOW and operation proceeds to normal self-refresh control.

Next, referring to FIGS. 2, 7, 8, 9, and 10, the operation of the ECC controller 6 will be described.

During the super self-refresh mode, the ECC controller 6 produces the internal commands/addresses to the SDRAM 10 and the control signal to the ECC-CODEC circuit 7 in a single-phase synchronization in order to achieve the parity bit generation and the error correction. The ECC controller 6 independently operates the SDRAM 10.

The operation in FIG. 2 has already been described but supplemental description will herein be made. When the normal operation proceeds to the super self-refresh mode in response to the super self-refresh entry command (SSELF), the ENCODE signal is produced and the parity data generation (the process associated with writing of new data into the memory circuit) and writing of the parity data into the parity data region of the memory (Parity Generation with Refresh) are carried out (these operations are carried out during the entry time). Thereafter, the power supply is turned off and the super self-refresh is carried out. In response to an internal signal GENOFF, most part of the internal power supply (internal power supply generating circuits for a cell array section or a peripheral circuit section) are turned OFF (=0 V) and a long-time PAUSE (waiting with the internal power supply interrupted and set at 0 V) state is started. An internal signal GSTATE is produced to indicate that the internal power supply is completely started up or turned ON.

When the above-mentioned signal rises, i.e., when the power supply is started up again during the super self-refresh period, burst-refresh operation is carried out in which refresh of all cells is continuously carried out. In this refresh operation, error correction of the memory cells is not carried out.

The internal power supply OFF, the long-time PAUSE, the internal power supply ON, and the burst-refresh operation are repeated a desired number of times (the operations in the super self-refresh). Thereafter, the super self-refresh exit command (SSELFX) is produced and the super self-refresh comes to an end. Then, errors in the memory cell data caused under the influence of long-time suspension of refresh are corrected and the corrected data are rewritten (Correct with Refresh) (the operations in the exit time).

Finally, the refresh mode is exited (Exit2) and the normal operation is started.

The effects of the above-mentioned embodiment will be described.

(1) With the above-mentioned structure, a complicated circuit design can be avoided with an optimum circuit scale.

(2) By the output register circuit, an output delay of each block is unseen and a hazard is cleared.

(3) By adopting the single-phase synchronization circuit and by output shaping in (2), a logical synthesis tool can be applied to the command/address generators.

Thus, the semiconductor integrated circuit device according to the embodiment of this invention comprises the ECC controller 6. The ECC controller 6 is at least connected to the ECC-CODEC circuit 7 and the control logic 209 of the SDRAM 10.

The control circuit produces the command signals (IRAS-IWE in FIG. 3) and the command address signals (IA(0)-IBA(1) in FIG. 3) of internal origin in the manner similar to deciding the operation mode within the device in accordance with external specification (i.e., logical levels of the command signals RAS, CAS, and WE and the command address signals (address signals not serving as conventional addresses indicating access addresses but serving as command signals for determining the operation modes in time division) supplied from the outside). These signals are latched in single-phase synchronization (synchronization with either one of rise and fall of the clock) with an external clock (or an internal clock derived therefrom) and serve to produce the operation mode related to the super self-refresh. Preferably, the input buffer of the SDRAM selectively acquires the command/address signals supplied from the outside or the command/address signals of internal origin and the operation in the device is determined as described above. The ECC controller 6 has a circuit structure at least including the command generator 11, the address generator (for generating the conventional address and the command address in time division) 12, and the output register circuits (latch or FF) 14 through 17.

The ECC controller 6 having the above-mentioned structure is connected to the ECC-CODEC circuit 7 and the SDRAM (the control logic thereof) to perform control related to the super self-refresh. As shown in (1), the circuit for "selectively acquiring the command/address signals and determining the operation within the device", which is a component of the conventional SDRAM, is used in a portion for latching the external command signal and the address signal (command address) to determine the operation mode. Thus, an optimum circuit scale is achieved and a complicated circuit design can be avoided.

As shown in FIG. 3 and (2), the register circuits 13 to 17 are provided so that the output data are generated in synchronization with the internal clock. In this manner, the output delay of each block is unseen and the hazard resulting from the delay of the internal signal can be cleared.

By processing in the single-phase synchronization, the control system is simplified. Therefore, the circuit structure of the command signal generator and the address signal generator in the ECC controller 6 can be designed by the use of a logical synthesis tool.

Figure 11:
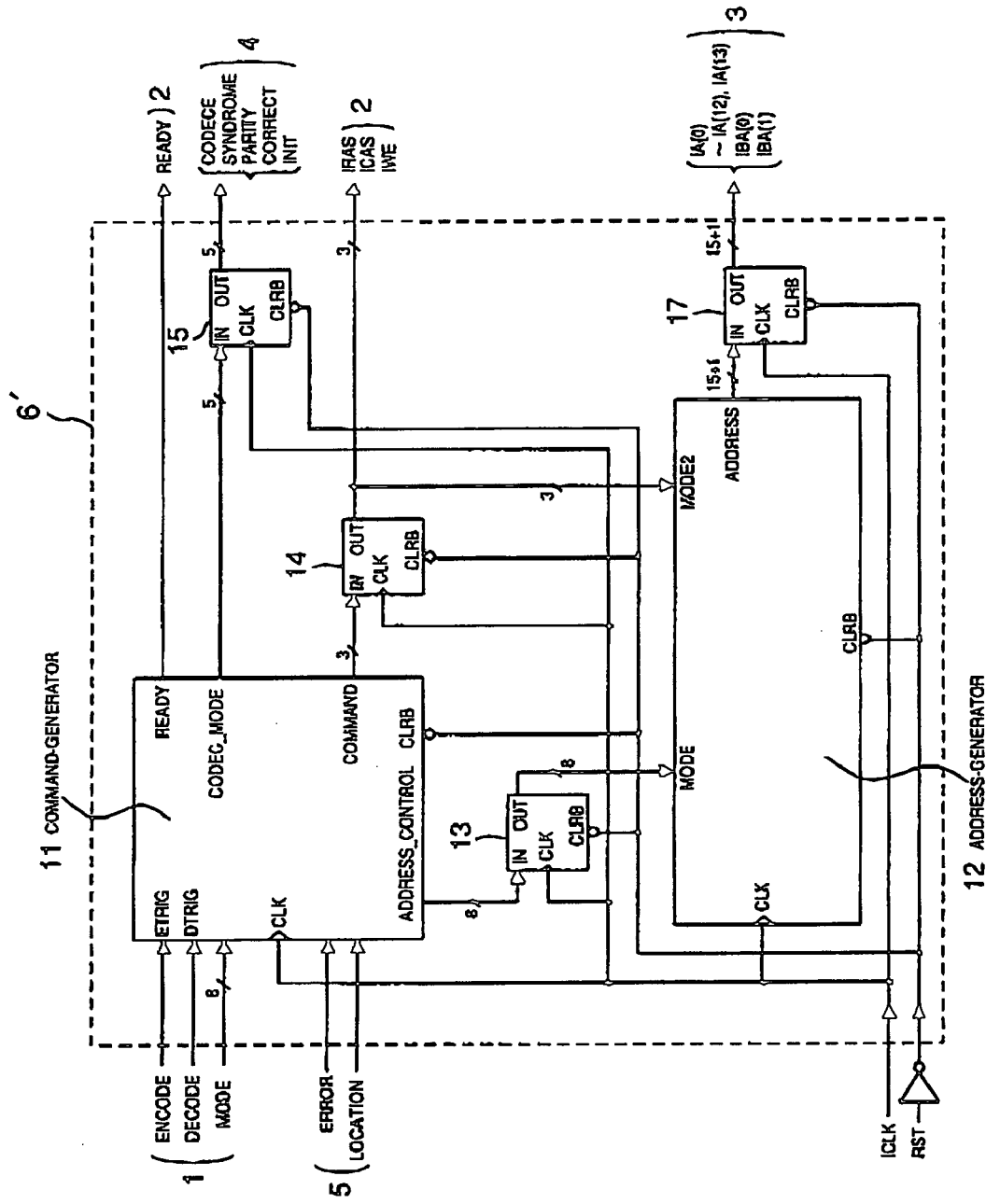
FIG. 11 is a block diagram showing another ECC controller used in the semiconductor integrated circuit device in FIG. 1 instead of the ECC controller illustrated in FIG. 3.

Referring to FIG. 11, an ECC controller 6' is used in the semiconductor integrated circuit device in FIG. 1 instead of the ECC controller 6. The ECC controller 6' does not have the register circuit 16 in the ECC controller 6 in FIG. 3. Therefore, the IRAS, ICAS, and IWE signals are produced one cycle earlier as compared with the ECC controller in FIG. 3. Except the above, If a BIST entry command (BIST: see External Operation at a second line in FIG. 13) is obtained as a result of decoding, the input buffer circuit (COMMAND DECODE) 8 delivers a start (START) instruction signal (CHECK) to the BIST controller 6" as the control signal 1. The start instruction signal (CHECK) is shown in a fourth line in FIG. 13 as a high-level part. At the time when the input buffer circuit (COMMAND BUFFER) 8 obtains the BIST entry command (BIST), supply of the external clock (CLK: see a first line in FIG. 13) to the SDRAM 10 is stopped. Supplied with the start instruction signal (CHECK), the BIST controller 6" is supplied with the Internal clock (ICLK: see a fifth line in FIG. 13). Supplied with the internal clock, the. BIST controller 6" delivers an operation mode signal 4 representative of checking to the error detection circuit (instead of the ECC-CODEC circuit 7 in FIG. 1).

Supplied with the operation mode signal 4 representative of the checking, the error detection circuit (instead of the ECC-CODEC circuit 7 in FIG. 1) starts a checking operation. Specifically, the error detection circuit generates the parity data (check bits for error detection and correction) with reference to the information data stored in each bank of the memory and writes the parity data into the parity memory region of each bank of the memory (self-test: see Internal Operation at an eleventh line (last line) in FIG. 13). Thereafter, some test disturbance may be performed.

Subsequently, the error detection circuit reads the parity data and, with reference to the data and the information data stored in the memory, detects an error in the information data (self-test: see Internal Operation at the last line in FIG. 13). The error detection is executed for all cells in the memory region.

When the BIST command is executed as described above, the operation of detecting an error in the memory data is carried out. Upon detection of the error, an error signal (ERROR: see a sixth line in FIG. 13) is produced. In addition, error location detection and correction are carried out although not shown in the figure.

After completion of the above-mentioned self-test in the error detection circuit, the BIST controller 6" delivers an end signal (READY: see a tenth line in FIG. 13) to the input buffer circuit (COMMAND DECODE) 8 as the internal command 2.

The input buffer circuit (COMMAND DECODE) 8 receives and decodes the end signal (READY) as the internal command 2 and then stops supply of the start instruction signal (CHECK: the fourth line in FIG. 13) to the BIST controller 6". The supply of the internal clock (ICLK: the fifth line in FIG. 13) to the BIST controller 6" is also stopped.

Then, self-test TIME is exited and the operation comes to an end in response to a BIST exit command (BISTX: see External Operation in the second line in FIG. 13) from the outside.

Now, input/output signals of the BIST controller 6" in FIG. 12 will be described.

BISTR, BISTW, TPH, DCKE, ECKE . . . Operation mode signals of the error detection circuit (an example being illustrated in FIG. 14).

BISTR: READ mode. When this signal is HIGH, it is possible to acquire MA output data and to carry out comparison with the expectation data (error judgment) corresponding to the operation timing (internal address).

BISTW: WRITE mode. When this signal is HIGH, input data (expectation data) corresponding to the operation timing (internal address) are delivered to the WB and written into the memory cells.

TPH: Switching between 0 and 1 of the expectation data (write data, read data). For example, when this signal is LOW, 0 data are indicated.

DCKE: When this signal is HIGH, DCLK is generated from ICLK and the expectation data are sent to an error judging circuit.

ECKE: When this signal is HIGH, ECLK is generated from ICLK and the result of judgment is recorded in an error recording circuit (in case where ECLK is always operated, an erroneous judging result will be acquired).

IXA(0)–IXA(12), IYA(0)–IYA(8), IBA(0), IBA(1) . . . Internal addresses (X and Y are respectively produced), internal bank addresses.

The address corresponding to the timing of the expectation data write/read operations is produced.

Figure 14:
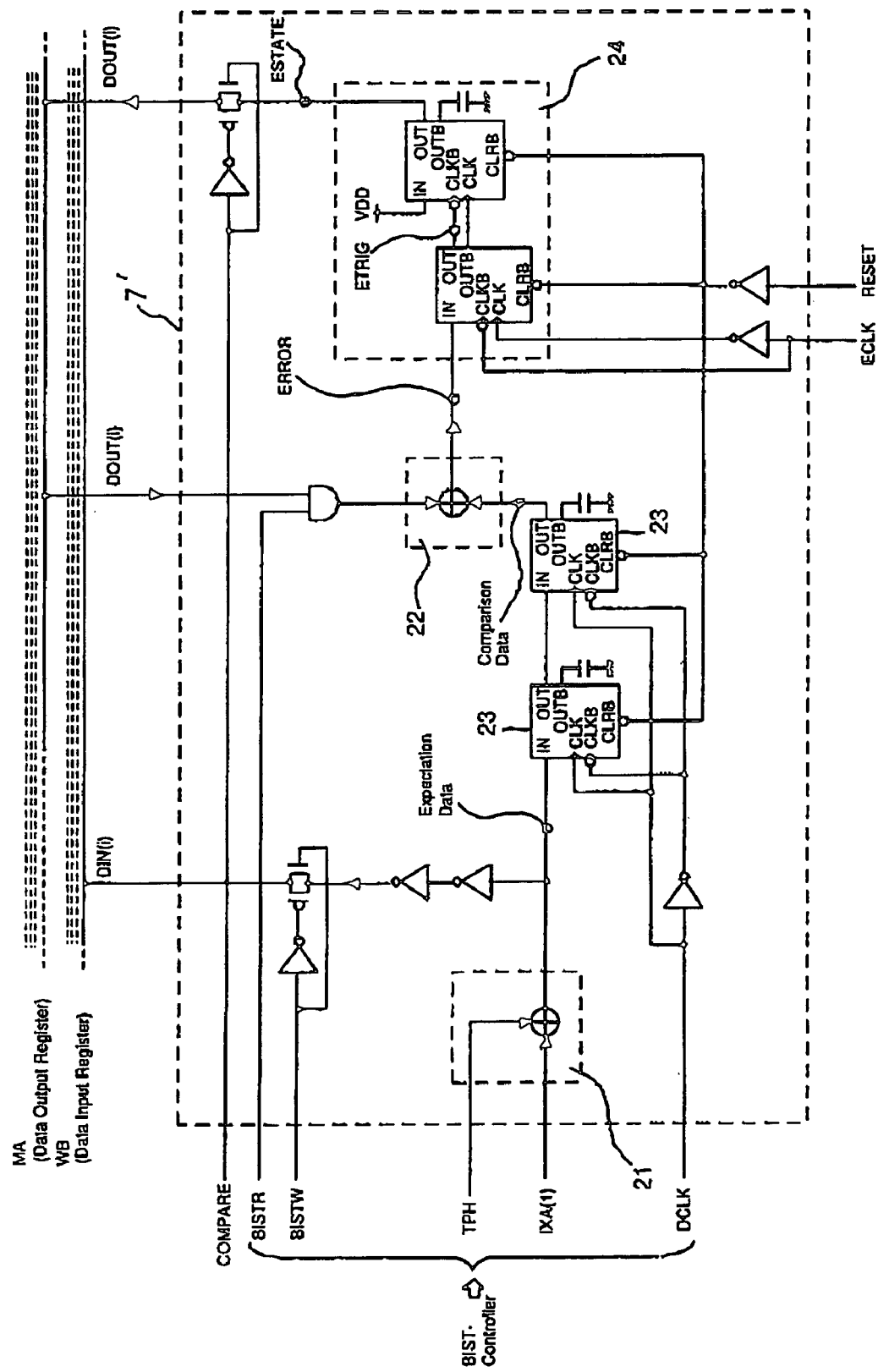
FIG. 14 is a view showing an error correction circuit which can be used in the semiconductor integrated circuit device in FIG. 1 instead of the ECC-CODEC circuit illustrated in FIG. 6.

Referring to FIG. 14, an error detection circuit 7' is used in the semiconductor integrated circuit device in FIG. 1 instead of the ECC-CODEC circuit 7.

The error detection circuit 7' comprises a data scrambler 21 having an EX-OR circuit, clock (CL) adjusting flip-flop circuits 23 arranged in two stages and connected to an output of the data scrambler 21, an error judging circuit 22 having an EX-OR circuit, and an error recording circuit 24 having flip-flop circuits arranged in two stages.

The error judging circuit 22 compares readout data (DOUT(1)) from the memory and no-error data produced through the flip-flop circuits 23 in two stages to produce an ERROR signal which has a H level if an error is detected. The error signal is sent through the flip-flop circuits in two stages in the error recording circuit 24 to be kept at a H level in DC and delivered through a switch as an error state signal ESTATE (see a ninth line in FIG. 13).

Figure 15:
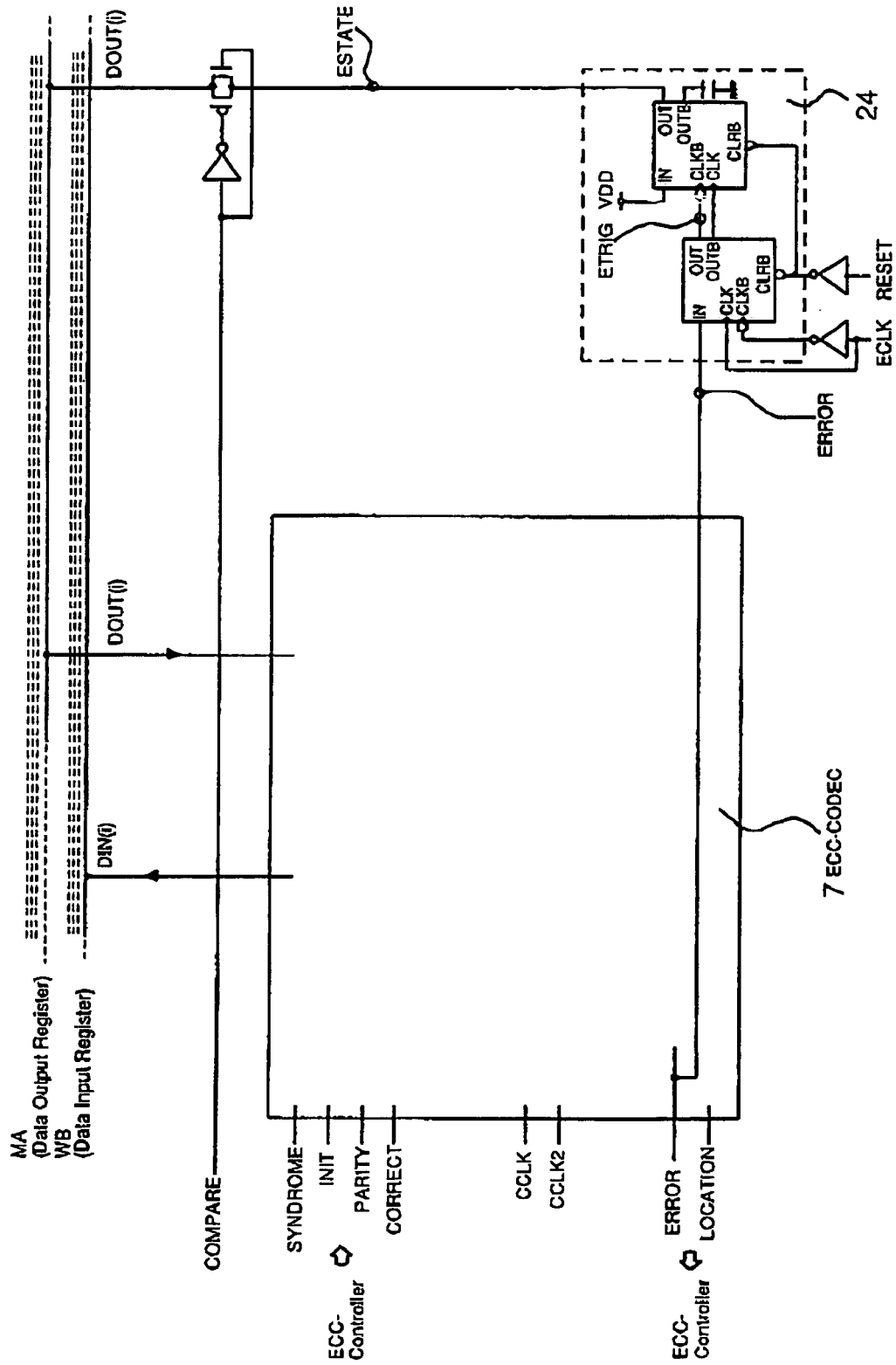
FIG. 15 is a block diagram showing an example in which the semiconductor integrated circuit device in FIG. 1 includes an error recording circuit added to the ECC-CODEC circuit.

Referring to FIG. 15, the above-mentioned error recording circuit 24 is added to the ECC-CODEC circuit 7 in the semiconductor integrated circuit device in FIG. 1 so as to hold the H level output of the ERROR signal in DC. The ECC-CODEC circuit carries out error detection in the Correcting operation. This is applied to the BIST operation in the circuit illustrated in FIG. 15. In an error judging cycle (a cycle in which result of judgment of presence/absence of error is produced after completion of syndrome calculation of one code word), ECLK carries out clocking operation of one clock and the error recording circuit holds the ERROR signal as an ETRIG signal. When the ETRIG signal is changed from LOW to HIGH, the error state signal ESTATE is turned HIGH. This state is held unless a RESET signal is supplied. Thus, if the data read in the Correcting operation has an error even in one bit, the error state signal ESTATE is turned HIGH and held. Upon completion of the BIST operation, the result ESTATE (see the ninth line in FIG. 13) is read from the error recording circuit 24 in response to the BIST exit command (BISTX: see the second line in FIG. 13) from the outside.

Figure 16:
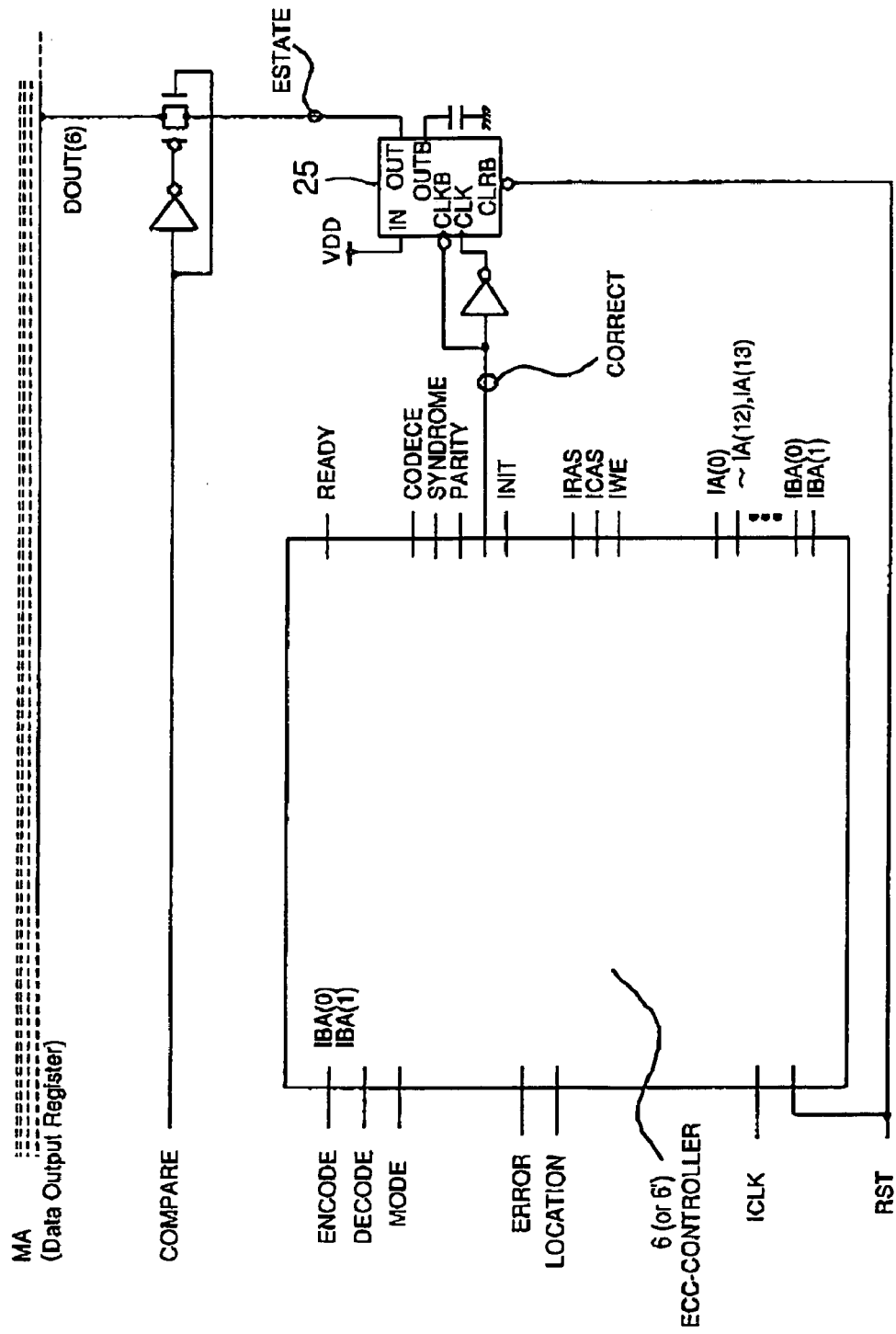
FIG. 16 is a view showing an example in which an error detection circuit is added to the ECC controller illustrated in FIG. 3 or 11.

Referring to FIG. 16, the error detection circuit is added to the ECC controller 6 (FIG. 3) or the ECC controller 6' (FIG. 11) for the purpose of application to the BIST operation. Upon detection of an error, the ECC controller 6 or 6' in FIG. 16 proceeds to the error location detection. The CORRECT signal delivered to the ECC-CODEC circuit 7 is turned into a H level. In order to hold the above-mentioned state (H level) in DC, a D flip-flop circuit 25 is added. The D flip-flop circuit 25 holds the H level in DC so as to improve matching between the ECC-CODEC circuit 7 and the ECC controller 6' following the BIST operation.

Specifically, the CORRECT signal of the ECC controller 6' is turned HIGH only if an error is detected as a result of syndrome calculation. Thereafter, operation proceeds to error location detection and error correction. Utilizing such characteristic of being turned HIGH only if an error is detected, detection is made about whether or not the CORRECT signal is turned HIGH at least once. In this case, modification of the ECC-CODEC circuit 7 is unnecessary.

With the above-mentioned structure, the error detection and correction functions for the memory data in the super self-refresh function are used and applied to the BIST circuit. When the BIST exit command (BISTX: see the second line in FIG. 13) is executed, the operation of detecting an error in the memory data is carried out by the above-mentioned self-test (self-test: see the last line in FIG. 13). Upon detection of the error, the ERROR signal is produced. In addition, although not shown in the figure, error location detection and correction can be carried out and the self-test can be carried out.

Herein, supplemental description will be made in conjunction with FIG. 1. The SDRAM 10 in the embodiment is a 64-Mb SDRAM and has a word structure of x 8. The X address (including the bank address) is 14 bits in total. The Y address is 9 bits in total. The parity bit storage region is expanded in the Y direction of each bank. In order to access to the parity bit storage region, 9 bits are insufficient for the Y address and 10 bits (=9+1) are used. Correspondingly, Y address registers, Y address lines, Y (column) decoders, sense amplifiers, and the like are increased in number.

In the ECC-CODEC circuit 7, ECC-CODEC is disposed for each IO line. In-this example, an internal I/O is 8 bits. Therefore, in the ECC-CODEC circuit 7, 8 CODECs are disposed. If solid defect is present in the parity bits, redundant relief is executed like in normal bits.

The ECC-CODEC circuit 7 may be arranged in any location on an internal IO bus. The degree of freedom in layout is assured and chip-size overhead can be suppressed.

Figure 17:
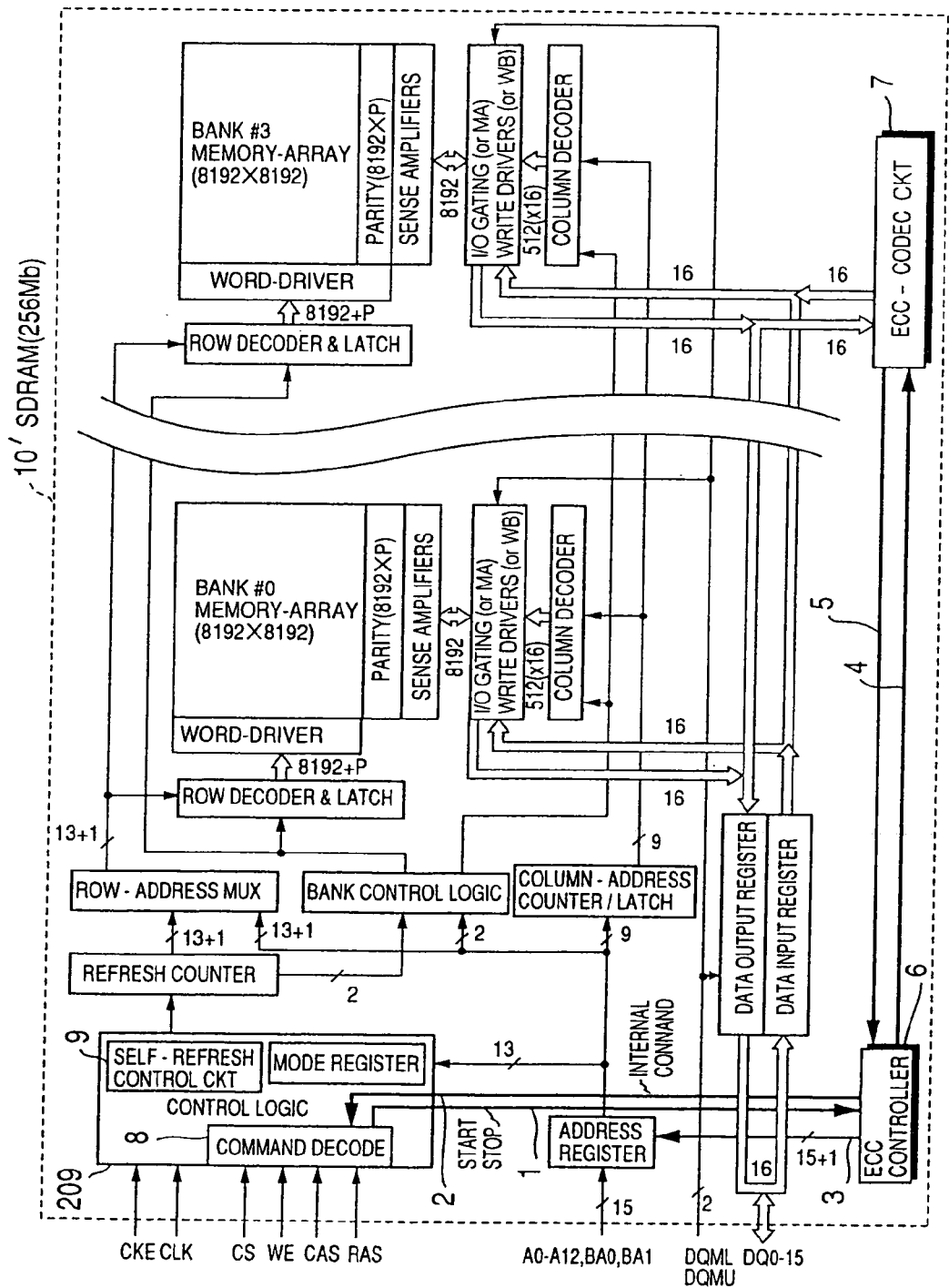
FIG. 17 is a block diagram of a semiconductor integrated circuit device according to another embodiment of this invention.

Referring to FIG. 17, a semiconductor integrated circuit device according to another embodiment of this invention is shown. In the semiconductor integrated circuit device, the SDRAM 10' is a 256-Mb SDRAM and has a word structure of x 16. The X address (including the bank address) is 15 bits in total. The Y address is 9 bits in total. The parity bit storage region is expanded in the X direction of each bank In order to access to the parity bit storage region, 15 bits are insufficient for the X address and 16 bits (=15+1) are used. Correspondingly, X address registers, X address lines, X (row) decoders, word drivers, and the like are increased in number.

Refresh cycles are generally 8192 cycles but are (8192+P) cycles herein. For example, if the (1040, 1024) code is used, the parity bits are 4M bits (8192×128×4 banks) and the refresh cycles are 8320 (8192+128) cycles.

In the ECC-CODEC circuit 7, ECC-CODEC is disposed for each IO line. In this example, an internal I/O is 16 bits. Therefore, in the ECC-CODEC circuit 7, 16 CODECs are disposed. The ECC-CODEC circuit 7 may be arranged in any location on the internal IO bus. The degree of freedom in layout is assured and chip-size overhead can be suppressed.

Figure 18:
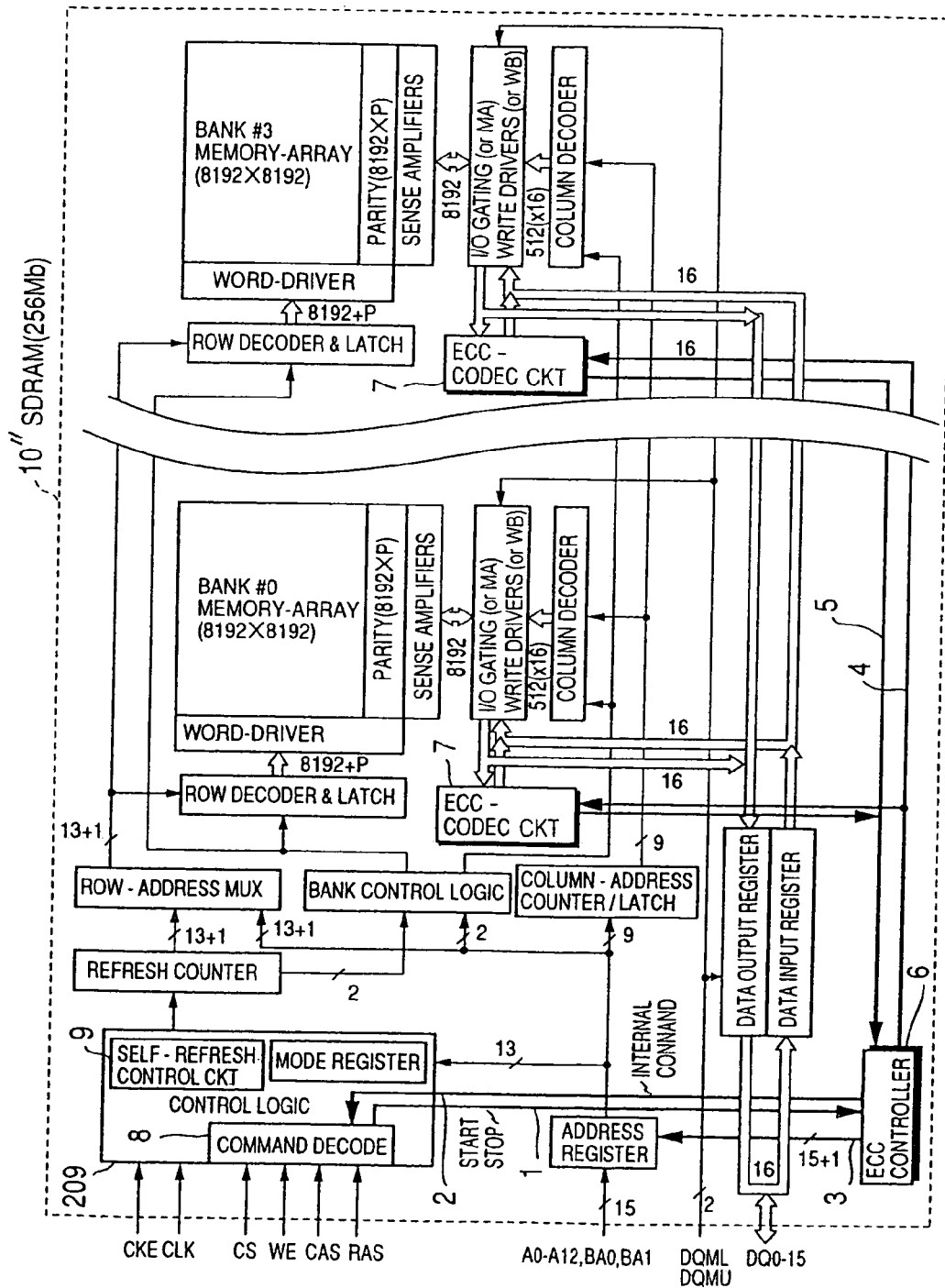
FIG. 18 is a block diagram of a semiconductor integrated circuit device according to still another embodiment of this invention.

Referring to FIG. 18, a semiconductor integrated circuit device according to still another embodiment of this invention is shown. In the semiconductor integrated circuit device, the SDRAM 10" is a 256-Mb SDRAM and has a word structure of x 16 like in FIG. 17. However, the ECC-CODEC circuit 7 is arranged for each I/O of each memory bank. In this case, 16 ECC-CODECs are arranged in each ECC-CODEC circuit 7. Thus, the ECC-CODECs, 16 per bank and 64 in total, are arranged. This results in a disadvantage in view of chip-size overhead. The degree of freedom in layout is not achieved and the ECC-CODEC must be disposed near each MA (main amplifier) and each WB (write buffer).

However, by simultaneous memory access to four banks, it is possible to carry out coding (Parity-Generation) and decoding (Correct) operations in a short time period corresponding to ¼ of that required in FIG. 17. As a demerit, the current consumption in the coding (Parity-Generation) and the decoding (Correct) operations is as large as twice or more in the simultaneous memory access to four banks. Which is to be selected depends upon trade-off between the current consumption and the processing time. The rate of the internal clock may be adjusted. The processing time of the coding (Parity-Generation) is the entry time into the super self-refresh mode but is not recognized by a user. Even if the exit instruction is given during the processing, the normal state can be directly started without taking any action because the data are not collapsed. Thus, since the processing time of the coding need not be shortened, the memory access may be carried out bank by bank.

On the contrary, the processing time of the decoding (Correct) is the exit time of the super self-refresh mode and is recognized by the user. As a matter of fact, the normal state can not be started unless correction of collapsed data is finished. Therefore, the user must wait completion of processing. Thus, the decoding time is preferably as short as possible. Therefore, the simultaneous memory access to four banks is desirable.

The above-mentioned structure is disadvantageous with respect to the chip size but has flexibility in selecting the exit time or the current consumption (in actual use, the waiting time in the data holding state is overwhelmingly long, so the current consumption of ENTRY/EXIT does not affect the battery life).

Figure 12:
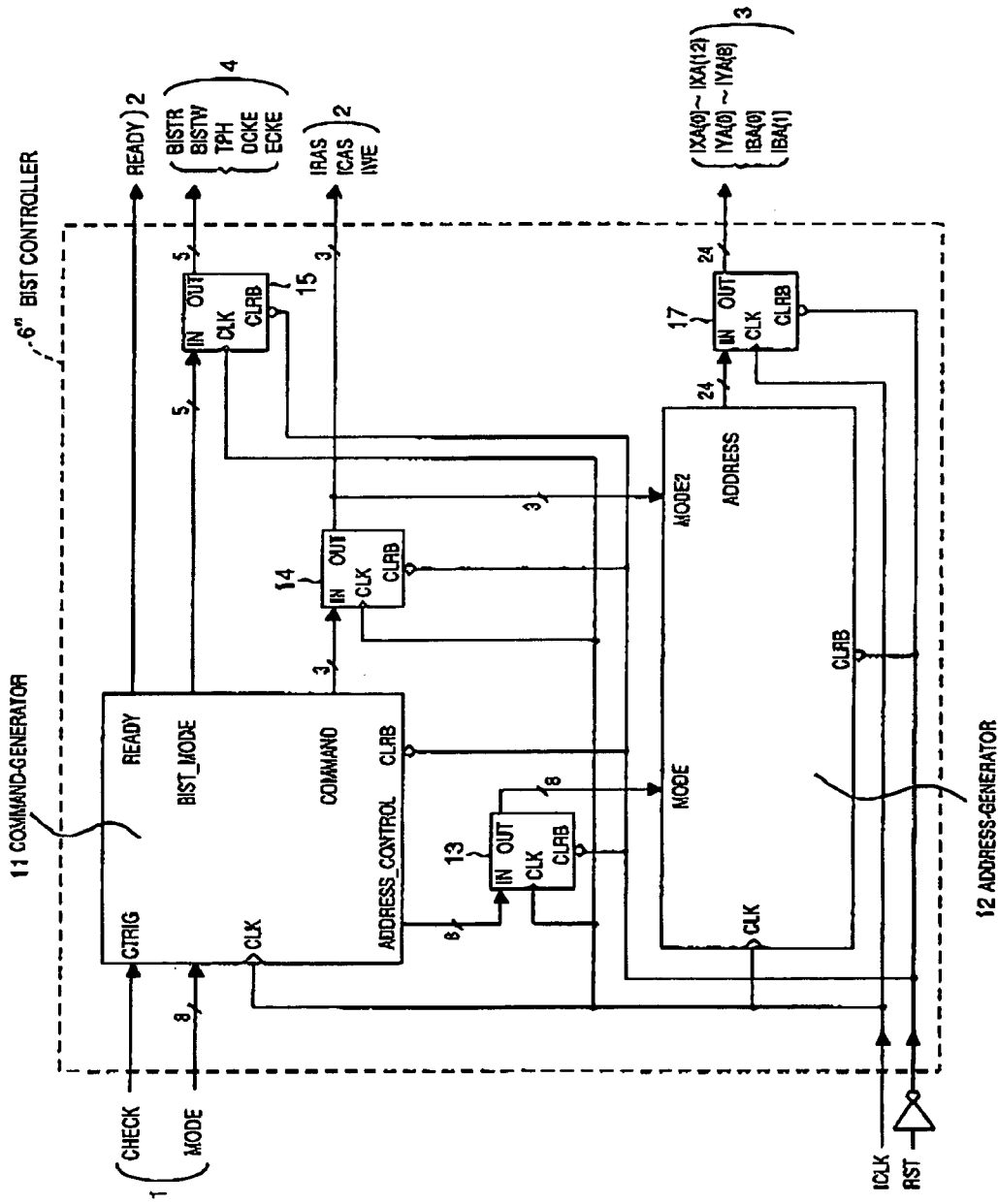
FIG. 12 is a block diagram showing a BIST controller used in the semiconductor integrated circuit device in FIG. 1 instead of the ECC controller illustrated in FIG. 3.
Figure 19:
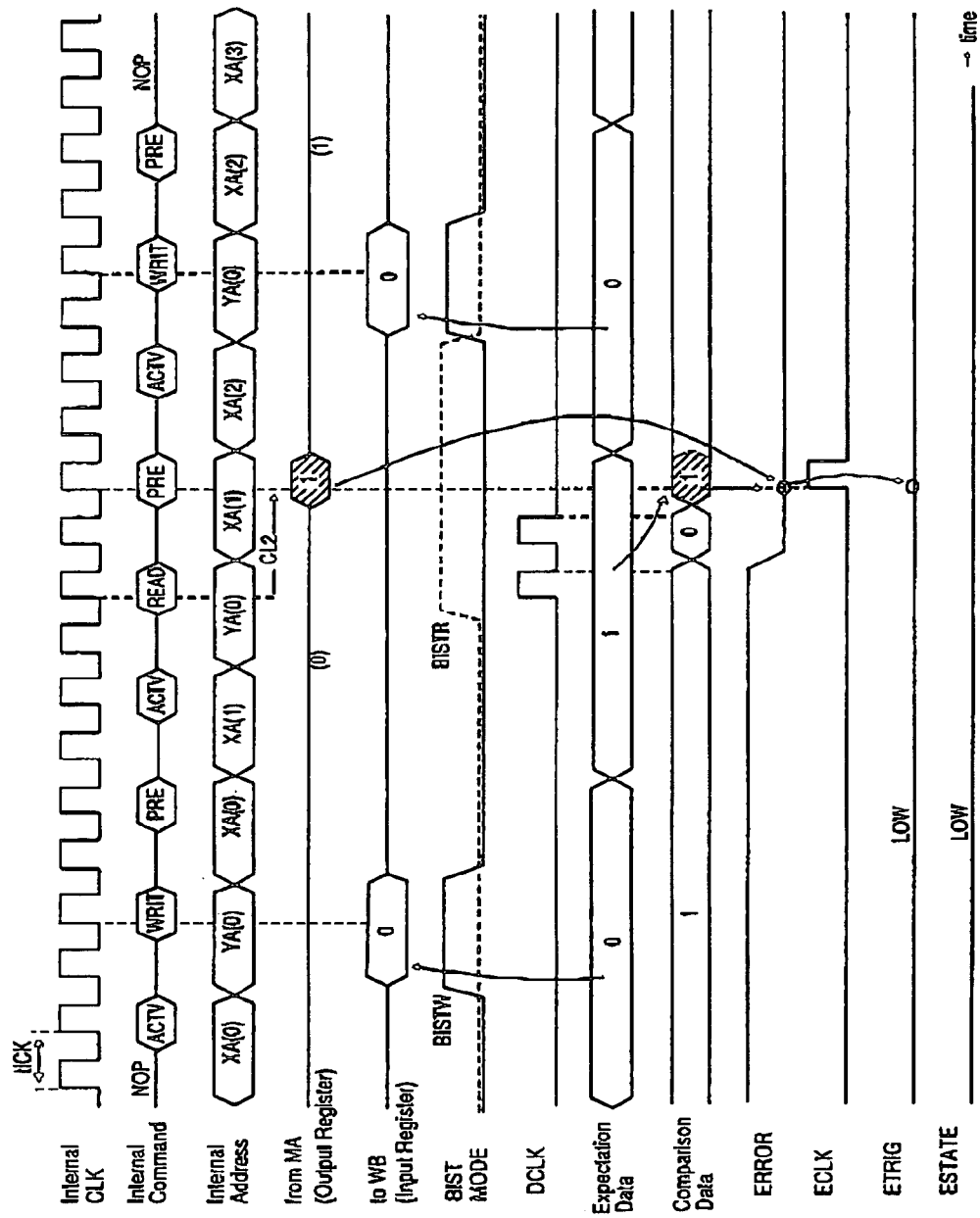
FIG. 19 is a view for describing an example 1 (burst length 1, no error) of a self-test operation of the BIST controller illustrated in FIG. 12.
Figure 20:
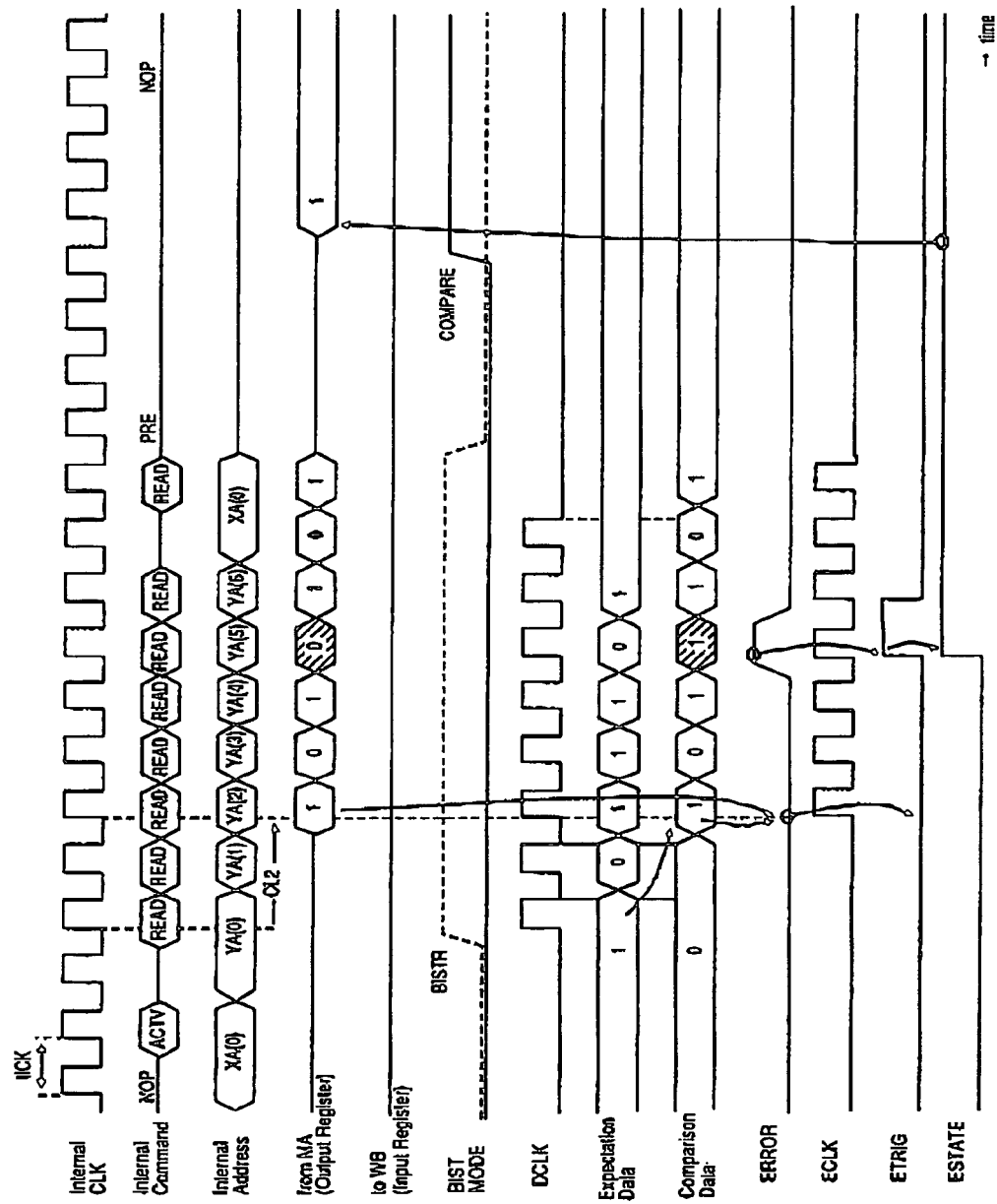
FIG. 20 is a view for describing an example 2 (burst operation, occurrence of error, reading of result) of the self-test operation of the BIST controller illustrated in FIG. 12.

FIG. 19 shows an example 1 (burst length 1, no error) of the self-test operation of the BIST controller 6" in FIG. 12. FIG. 20 shows an example 2 (burst operation, occurrence of error, reading of result) of the self-test operation of the BIST controller 6" in FIG. 12. Referring to FIGS. 19 and 20, supplemental description will be made about the operation of the BIST controller 6" in FIG. 12.

Supplied with the self-test entry command (BIST), the input buffer circuit (COMMAND DECODE) 8 of the control logic 209 of the SDRAM 10 in FIG. 1 turns the start signal (or the start instruction signal) (CHECK) HIGH. In response to the start signal (CHECK) of HIGH, the BIST controller 6" in FIG. 12 produces the internal operation command, the address, the expectation data and accesses to all bits, as shown in FIGS. 19 and 20. By the mode signal supplied to the BIST controller 6", a test content is selected and an address pattern and a data pattern, such as X-MARCHING (1ON), are determined. Referring to FIG. 14, 0/1 (LOW/HIGH) is selected by the data scrambler 21 and TPH for the expectation data. By DCLK, the expectation data are synchronized with the timing of the readout data (adaptable to the CAS latency).

In FIG. 14, the readout data are compared with the expectation data (Expectation-Data->Comparison-Data). By ECLK, the comparison result (ERROR) is recorded in the error recording circuit 24 comprising the flip-flop circuits. The error detection record is maintained unless it is erased by the RESET signal.

After completion of a series of self-test operations, the input buffer circuit (COMMAND DECODE) 8 of the control logic 209 of the SDRAM 10 in FIG. 1 produces the RESET signal as pulse output and turns the start signal (CHECK) LOW. Then, an external command can be accepted.

When the input buffer circuit (COMMAND DECODE) 8 of the control logic 209 of the SDRAM 10 in FIG. 1 is supplied with the self-test exit command (BISTX in FIG. 13), a COMPARE signal is turned HIGH. In FIG. 14, the error record signal (or the error state signal) ESTATE is produced from the output buffer to the outside. In this example, presence of error is HIGH while absence of error is LOW.

As the effect of the BIST, the selection test is possible by an inexpensive device and the test cost is significantly saved, as will readily be understood.

Supplemental description will be made in conjunction with FIG. 19. Upon carrying out the writing operation, BISTW is turned HIGH and the expectation data (Expectation-Data) calculated are delivered to the WB (write buffer). Upon carrying out the reading operation, BISTR is turned HIGH. The readout data are taken into the error detection circuit and compared with the expectation data. However, no trouble is caused in operation if BISTW and BISTR are the same signal and always kept HIGH during the self-test.

Comparing the readout data with the expectation data, the readout data are coincident with the expectation data and no error is recorded.

Supplemental description will be made in conjunction with FIG. 20. The expectation data are issued in synchronization with the <READ> command and adjusted in timing with the readout data by the use of DCLK. The result ERROR of comparison with the readout data is acquired by ECLK to become the ETRIG signal. If the ETRIG signal is turned HIGH at least once, the error record signal ESTATE is turned HIGH and is not erased unless it is reset. In this example, the fourth bit of the readout data is different from the expectation data and ESTATE of HIGH (occurrence of error) is recorded. Finally, the COMPARE signal is turned HIGH and ESTATE is read to the outside.

Figure 21:
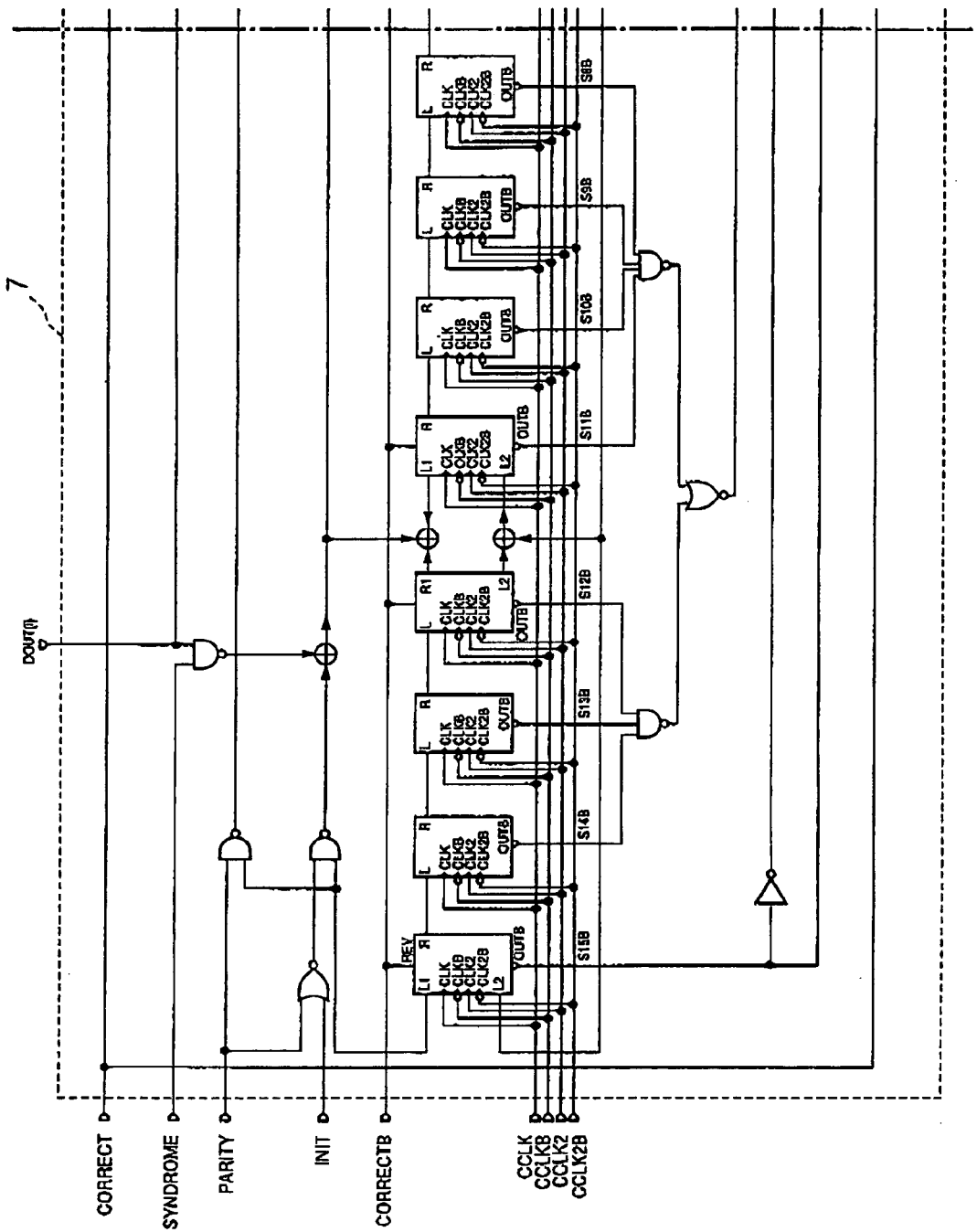
FIG. 21 is a view showing a left half of a specific example of the ECC-CODEC circuit illustrated in FIG. 6.
Figure 22:
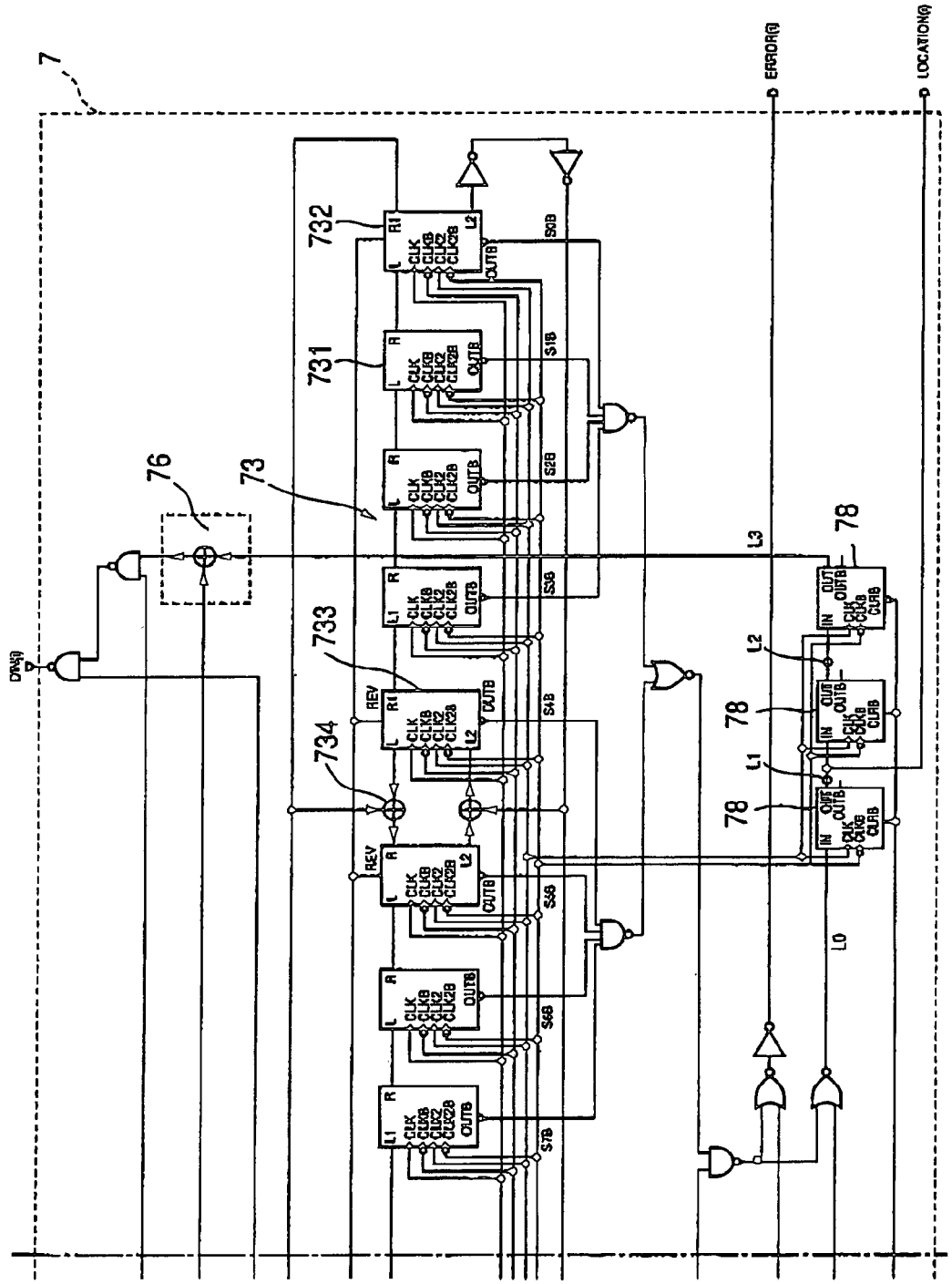
FIG. 22 is a view showing a right half of the specific example of the ECC-CODEC circuit illustrated In FIG. 6.

Referring to FIGS. 21 and 22, a specific example of the ECC-CODEC circuit 7 in FIG. 6 is shown. The ECC-CODEC circuit 7 illustrated in FIGS. 21 and 22 comprises the circulating circuit 73 and the EX-OR circuit 76 described in connection with the ECC-CODEC circuit 7 in FIG. 6. In the ECC-CODEC circuit 7 illustrated in FIGS. 21 and 22, register circuits 78 in three stages are inserted to an output bus of the error location detection signal (LOCATION).

Figure 23A:
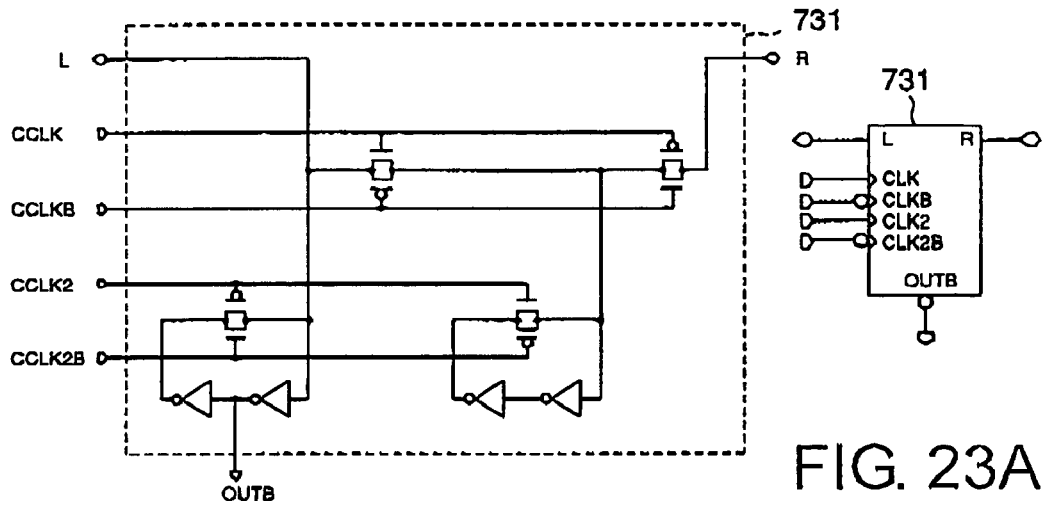
FIGS. 23A, 23B, & 23C are views showing shift registers of a left/right shift type in a circulating circuit of the ECC-CODEC circuit illustrated in FIG. 22.
Figure 23B:
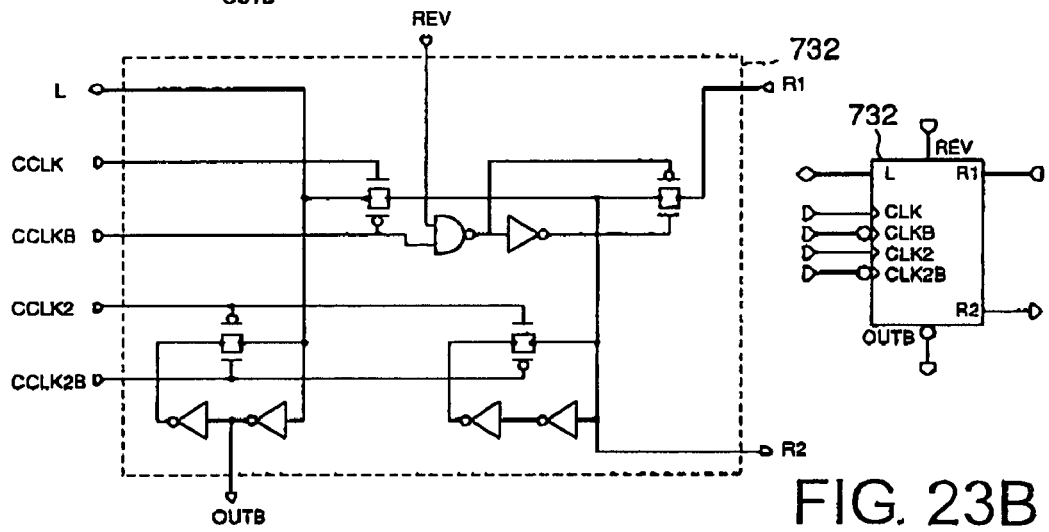
Figure 23C:
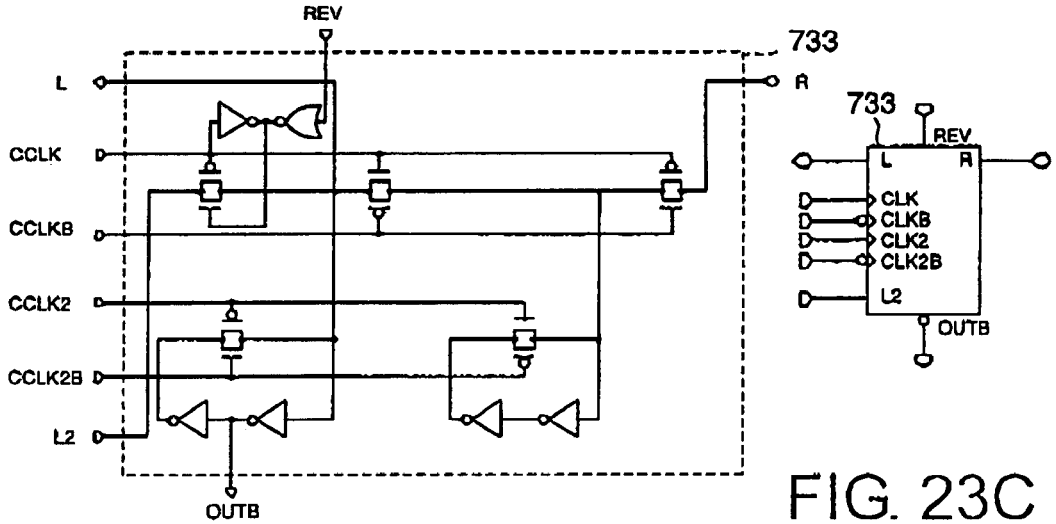

FIGS. 23A, 23B, and 23C show in detail shift registers 731, 732, and 733 of a left/right shift type in the circulating circuit 73 of the ECC-CODEC circuit 7 illustrated in FIG. 22, respectively.

Figure 24:
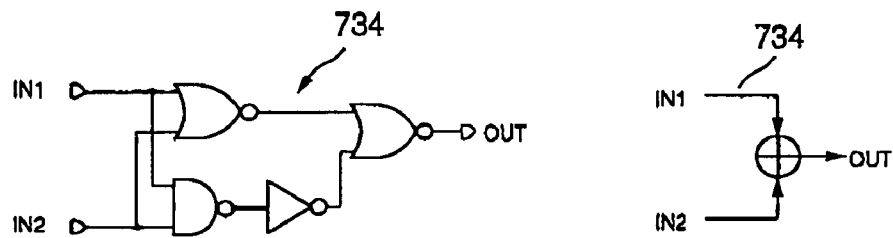
FIG. 24 is a view showing an EX-OR circuit in the circulating circuit of the ECC-CODEC circuit illustrated in FIG. 22.

FIG. 24 shows in detail an EX-OR circuit 734 in the circulating circuit 73 of the ECC-CODEC circuit 7 illustrated in FIG. 22.

In the ECC-CODEC circuit 7 illustrated in FIGS. 21 and 22, the ECC controller 6 (FIG. 3) is a single-phase synchronization circuit using the internal clock ICLK. The register circuits are inserted to the output bus. The register circuit 78 of a single stage is inserted to the output bus of the error location detection signal (LOCATION). With this structure, a response to the error location detection signal (LO in FIG. 22) in real-time is delayed by three clocks. Therefore, it is necessary to make the register circuits 78 in three stages store the detection result before three clocks and to carry out error correction.

Figure 25:
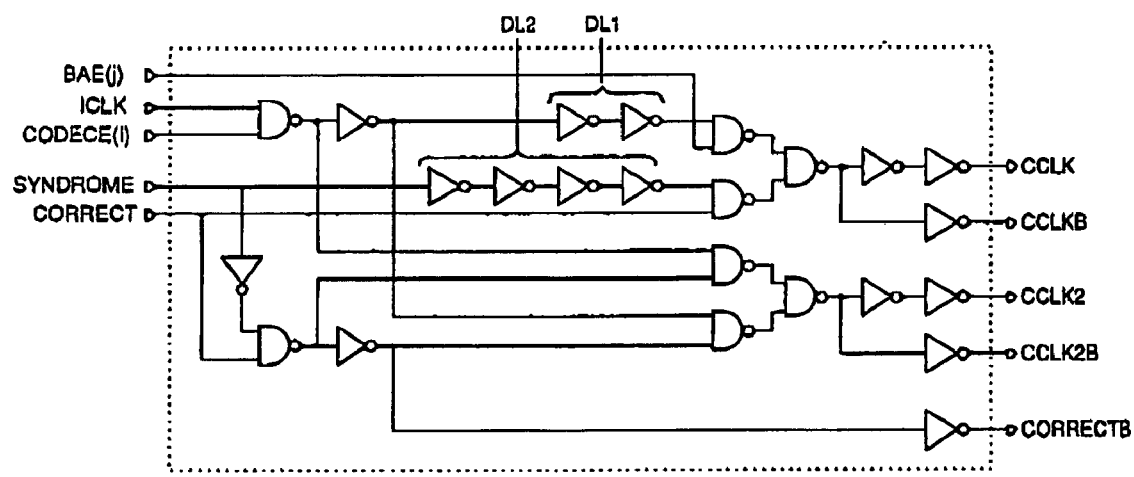
FIG. 25 is a view showing a circuit for supplying clocks to the ECC-CODEC circuit illustrated in FIGS. 21 and 22.

Referring to FIG. 25, a CODEC-CLK generator circuit for supplying clocks (CCLK, CCLKB, CCLK2, CCLK2B) to the ECC-CODEC circuit 7 in FIGS. 21 and 22 is shown. The CODEC-CLK generator circuit illustrated in FIG. 25 comprises a delay circuit DL1 including inverters in two stages and a delay circuit DL2 including inverters in four stages. A delay is produced between clock operation of CCLK and CCLKB an clock operation of CCLK2 and CCLK2B so as to assure an operation margin of the register circuits of a left/right shift type illustrated in FIGS. 23A to 23C. The operation margin will be described in conjunction with FIG. 23A by way of example. The register circuit of a left/right shift type carries out shift operation by the control clocks CCLK2 and CCLK2B for opening and closing two latch circuits on the left and the right and by the control clocks CCLK and CCLKB for copying the data of one latch circuit to the adjacent latch circuit. At first, when CCLK is changed from LOW to HIGH at first, the data in the left and the right latch circuits are the same. If CCLK2 is changed from LOW to HIGH later, no influence is given to the result. Next, when CCLK is returned from HIGH to LOW and if CCLK2 is returned from LOW to HIGH later, the right latch circuit is closed while the left latch circuit is opened. Therefore, the data are copied from the right latch circuit to the left latch circuit of the adjacent shift register so that the data flow from the right to the left. In other words, forward shift is not achieved. If CCLK2 is first returned from LOW to HIGH, the right latch circuit is opened and the left latch circuit is closed. Therefore, the data are copied from the left latch circuit in the adjacent shift register to the right latch circuit so that forward shift is carried out. In backward shift operation, CCLK and CCLKB are operated reversely in phase to CCLK2 and CCLK2B. In this case also, clock operation of CCLK2 and CCLK2B must be carried out first.

In FIG. 25, CODECE(i) is a CODEC enable signal transmitted from the ECC controller 6 (FIG. 3) to each bank. The symbol i means the bank address (i=0, 1, 2, 3).

BAE(j) is a bank enable signal transmitted from the input buffer circuit (COMMAND DECODE) 8 of the control logic 209 of the SDRAM 10 in FIG. 1 to each bank. Corresponding to the PASR mode, the bank enable signal is HIGH for the bank which can be activated. Herein, the symbol j means the bank address (j=0, 1, 2, 3).

For example, if the PASR mode indicates four banks (full bank, default), all of BAE(0) to BAE(3) are HIGH. In case of two banks, BAE(0) and BAE(1) are HIGH. If BAE(j) is LOW, CCLK is not supplied to the ECC-CODEC circuit 7 (FIGS. 21 and 22).

The above-mentioned circuit of FIG. 25 produces, from the internal clock ICLK, four clock signals (CLK, CLKB, CLK2, CLK2B) to be supplied the ECC-CODEC circuit 7 (FIGS. 21 and 22) and delivers the clock signals to a plurality of ECC-CODEC circuits 7. During the syndrome mode, CLK and CLK2 are operated in the same phase. In the correction mode, CLK and CLK2 are operated in reverse phases. By switching between the same-phase and the reverse-phase operations, the ECC-CODEC circuit 7 (FIGS. 21 and 22) enables forward and backward operations of the shift registers.

Figure 26:
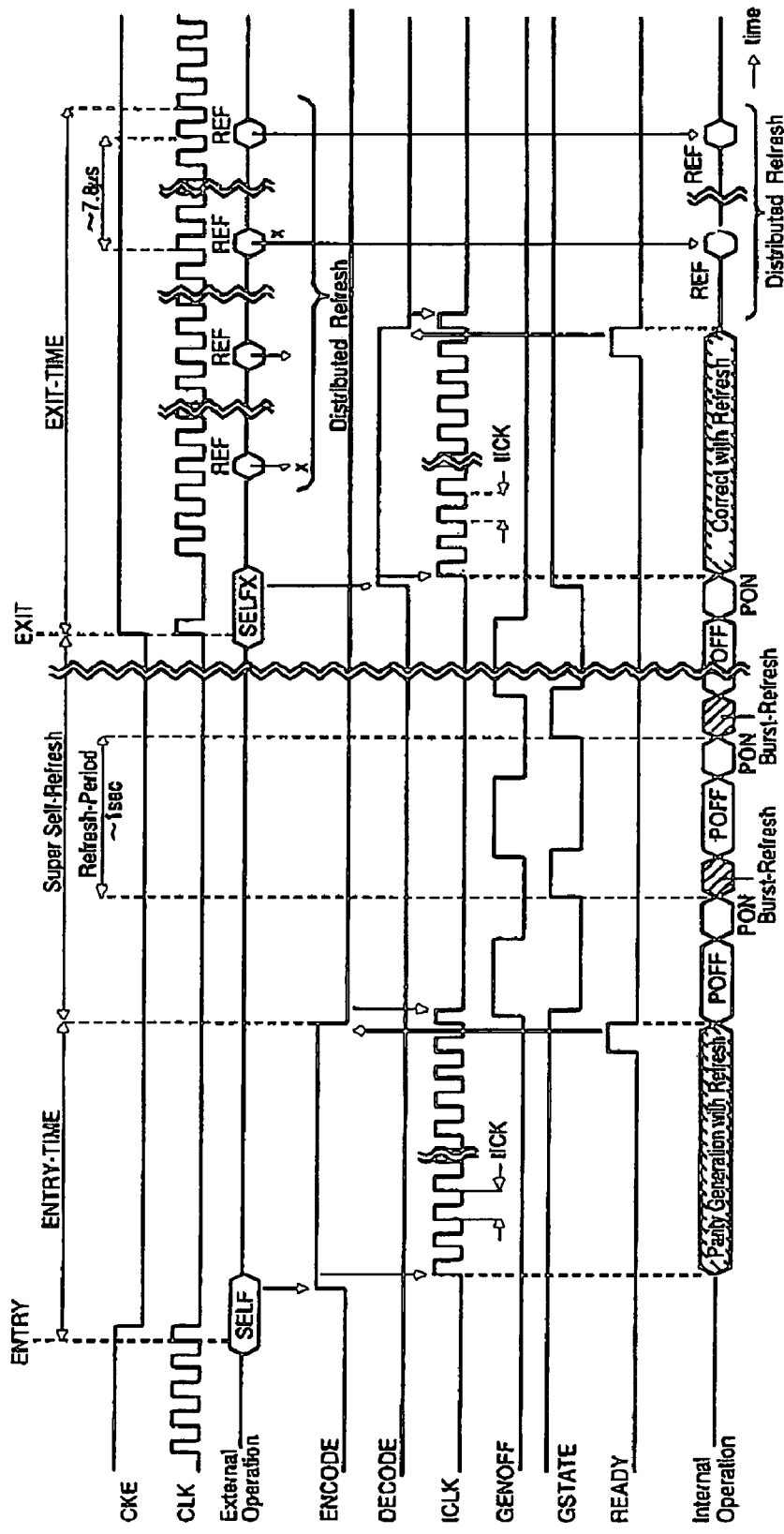
FIG. 26 is a waveform chart for describing another sequence of the super self-refresh operation (entry/exit scheme) of the semiconductor integrated circuit device illustrated in FIG. 1.

Referring to FIG. 26, another super self-refresh operation sequence (Entry/Exit Scheme) of the semiconductor integrated circuit device in FIG. 1 is shown.

In the entry exit scheme of the super self-refresh operation sequence illustrated in FIG. 2, the commends for "super self-refresh" (super self-refresh entry command (SSELF) and super self-refresh exit command (SSELFX)) are supplied to the input buffer circuit (COMMAND BUFFER) 8 of the control logic 209 of the SDRAM 10 in FIG. 1 separately from the normal self-refresh command known in the art. Thus, this scheme is not general. In other words, the user must develop another control scheme (chip set or software) different from that of a general-purpose DRAM and must make sacrifices in development cost and time in order to use the super self-refresh mode.

On the other hand, the entry/exit scheme shown in FIG. 26 can be used by a user of the general-purpose SDRAM. Without having the commands for "super self-refresh", the normal self-refresh commands (self-refresh entry command (SELF: see External Operation at the third line in FIG. 26) and self-refresh exit command (SELFX: see External Operation at the third line in FIG. 26)) are directly used. Thus, the entry/exit scheme is basically similar to that for the self-refresh commands.

After supplying the exit command (SELFX), it is assumed that only distributed refresh operation (in case of 256-Mb SDRAM, refresh cycles are 8 k cycles (8192 cycles) and, therefore, a <REF> command is supplied in a cycle of about 7.8 μsec in order to satisfy the refresh standard of 64 ms) generally carried out is performed during a defined exit-time (time period before completion of the correcting operation). During the correcting operation, the internal command issued by the ECC controller is accepted and the <REF> command supplied from the outside is neglected. After completion of the correcting operation, an idle state is restarted. Then, the <REF> command supplied from the outside is received and the refresh operation is carried out. In this manner, the operation time (exit time) depending upon the error rate of pause defect caused by a long-cycle refresh operation is absorbed and, holding the corrected data, the normal memory access operation can be started.

In the exit scheme shown in FIG. 2, the time required for the correcting operation is varied and unfixed. Therefore, after completion of the correcting operation, the self-refresh mode is automatically started. However, the self-refresh mode is no more than the operation of automatically carrying out the distributed refresh operation inside. Thus, the scheme in FIG. 26 is same in effect. Which scheme is to be selected depends on the user.

In case of the normal self-refresh, the exit time is present and is on the order of 100 ns. In this case, the exit time is a time period before completion of the correcting operation and is on the order of several hundred ms. Generally, in case where the SDRAM is used, the distributed refresh operation is always carried out and a desired operation command is supplied between the <REF> commands. Thus, the exit scheme in FIG. 26 is no special operation although the exit tim is long, and is basically similar to the normal self-refresh.

The entry/exit command may be same as the self-refresh command. In this case, the meaning of the command may be switched between the "super self-refresh" and the normal self-refresh by setting of MRS (Mode Register Set)or EMRS (Extended Mode Register Set).

In the foregoing, it is described that "the time required for the correcting operation is varied". In case of the schemes in FIGS. 2 and 26, ICLK of internal origin is operated as the synchronization clock. Therefore, its cycle has production tolerance. The entry time (required for Parity-Generation) is not precisely seen to the outside. Although not shown in the figure, CLK may be received from the outside during the entry/exit period and the entry/exit time may be defined by the number of cycles.

Figure 27:
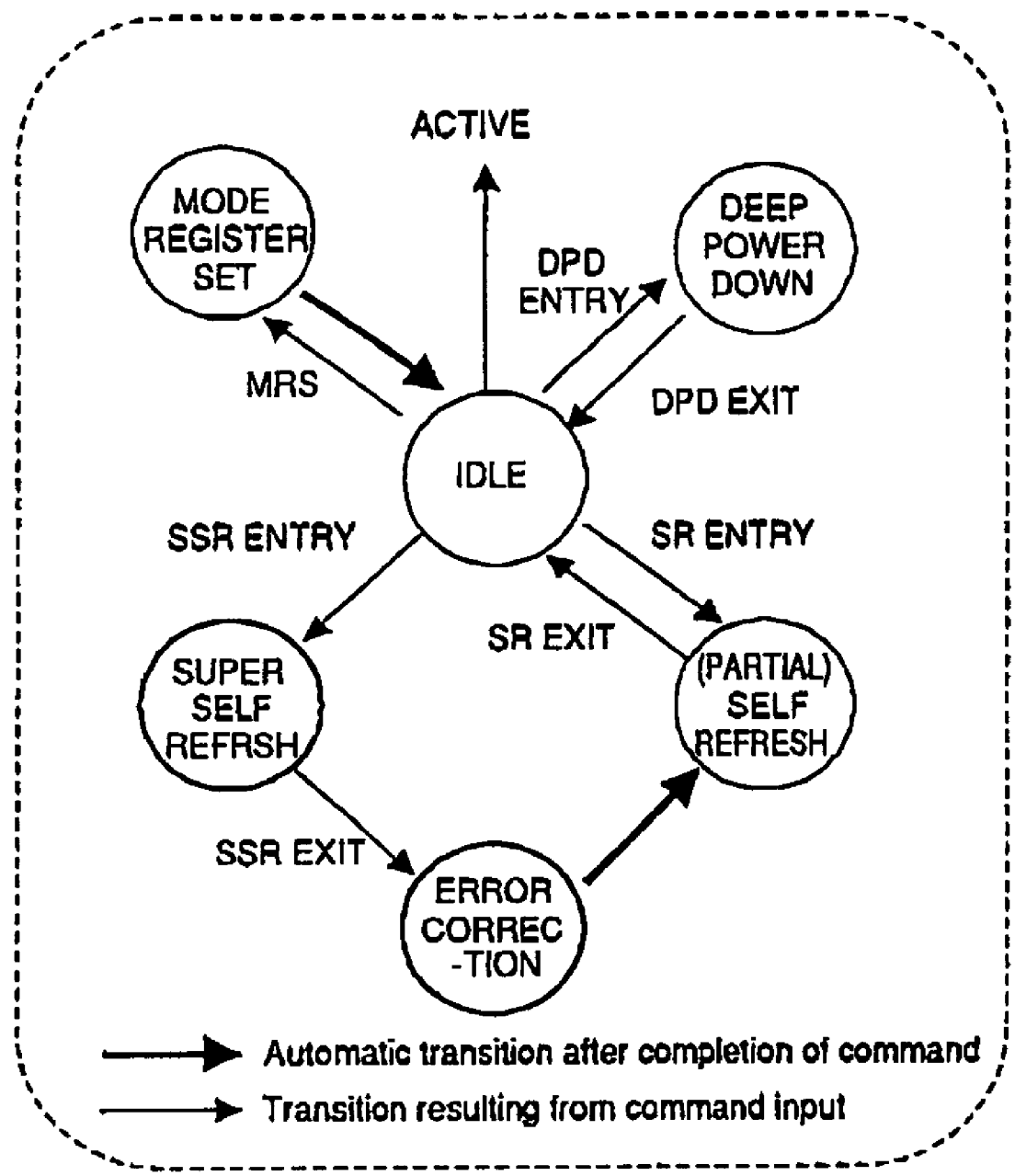
FIG. 27 is a state transition chart corresponding to the system in FIG. 2.
Figure 28:
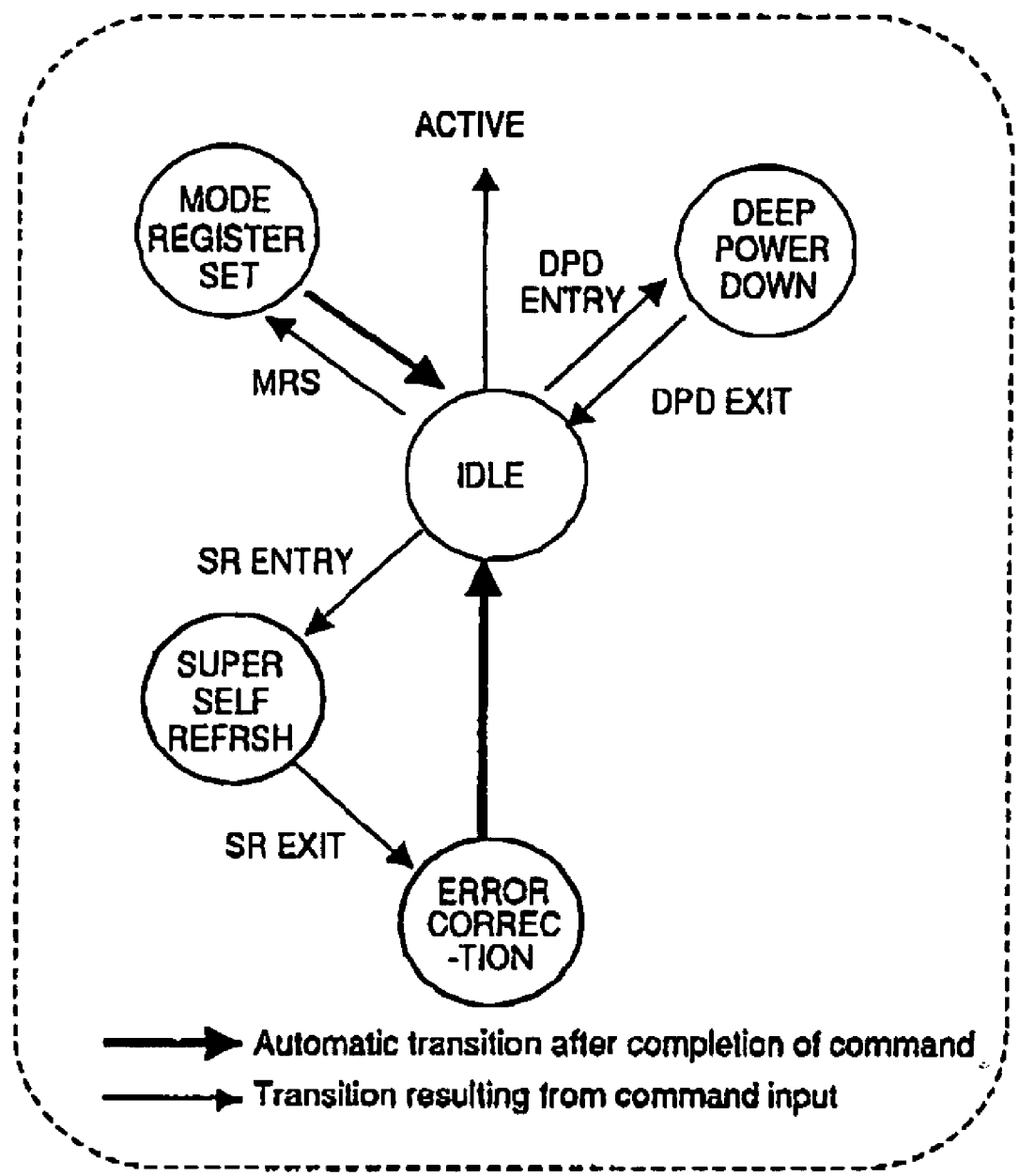
FIG. 28 is a state transition chart corresponding to the system in FIG. 26.

FIGS. 27 and 28 show state transition charts corresponding to the schemes in FIGS. 2 and 26. These are examples in which the super self-refresh mode is added to the state transition chart of a mobile RAM as a base.

The state transition chart in FIG. 27 corresponds to the scheme in FIG. 2. When a super self-refresh exit command (SSR EXIT) is inputted by a user, the state proceeds to a correct state (ERROR CORRECTION). After completion of the correct state, the state automatically proceeds to the self-refresh state. Herein, when a self-refresh exit command (SR EXIT) is inputted, exit is completed.

The state transition chart in FIG. 28 corresponds to the scheme in FIG. 26. As the commands for the "super self-refresh", a self-refresh entry command (SR ENTRY) and a self-refresh exit command (SR EXIT) are used instead of the super self-refresh entry command (SSR ENTRY) and the super self-refresh exit command (SSR EXIT) in FIG. 27. When the self-refresh exit command (SR EXIT) is inputted by a user, the state proceeds to the correct state (ERROR CORRECTION). When the correct state is finished, exit is simply completed.

Figure 29:
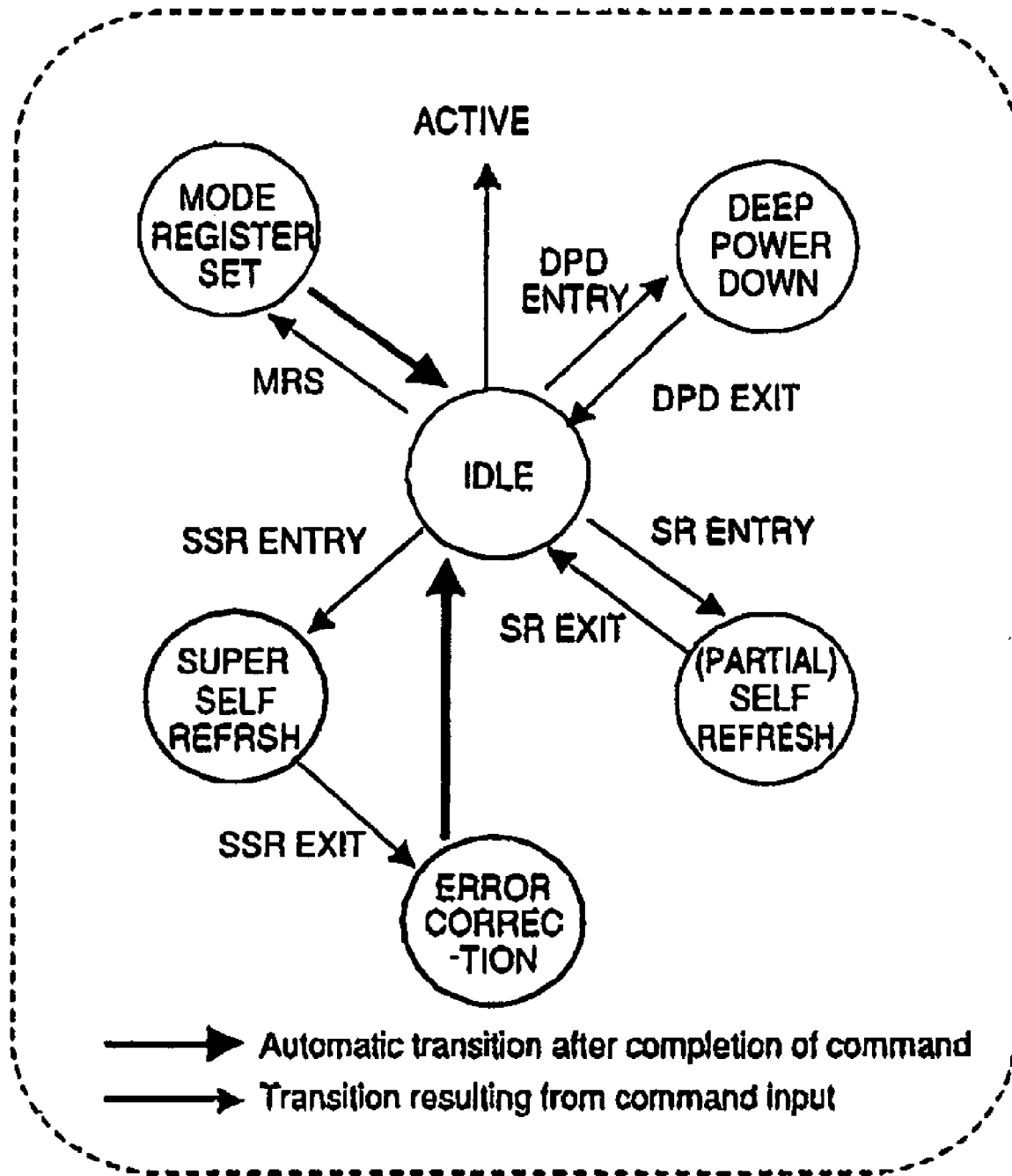
FIG. 29 is a state transition chart similar to that in FIG. 27.

Referring to FIG. 29, a state transition chart is similar to that in FIG. 27. When the super self-refresh exit command (SSR EXIT) is inputted by a user, the state proceeds to the correct state (ERROR CORRECTION). When the correct state (ERROR CORRECTION) is finished, exit is simply completed.

Figure 30:
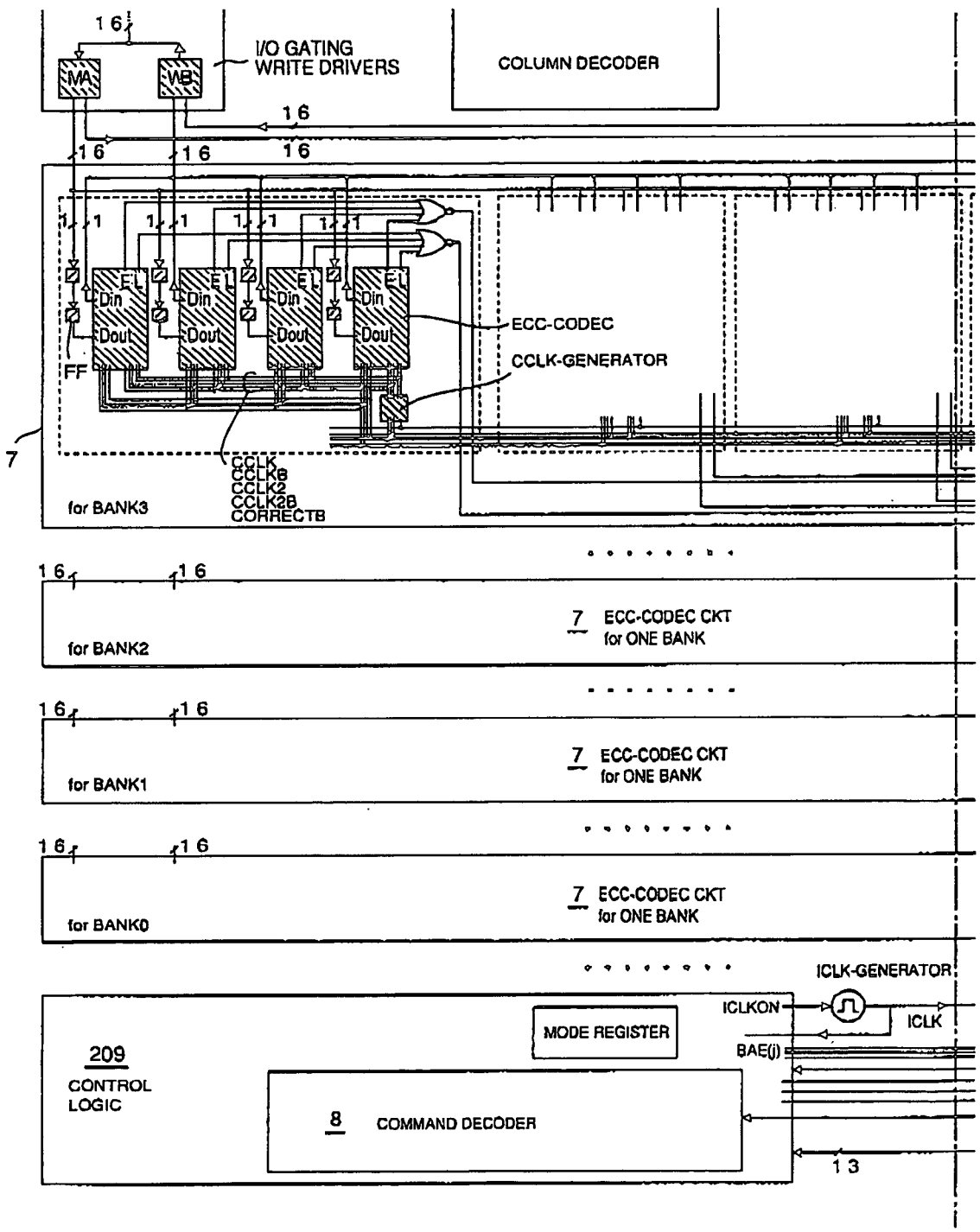
FIG. 30 is a view showing a left half of connection between an ECC controller and an ECC-CODEC circuit in the semiconductor integrated circuit device illustrated in FIG. 18.
Figure 31:
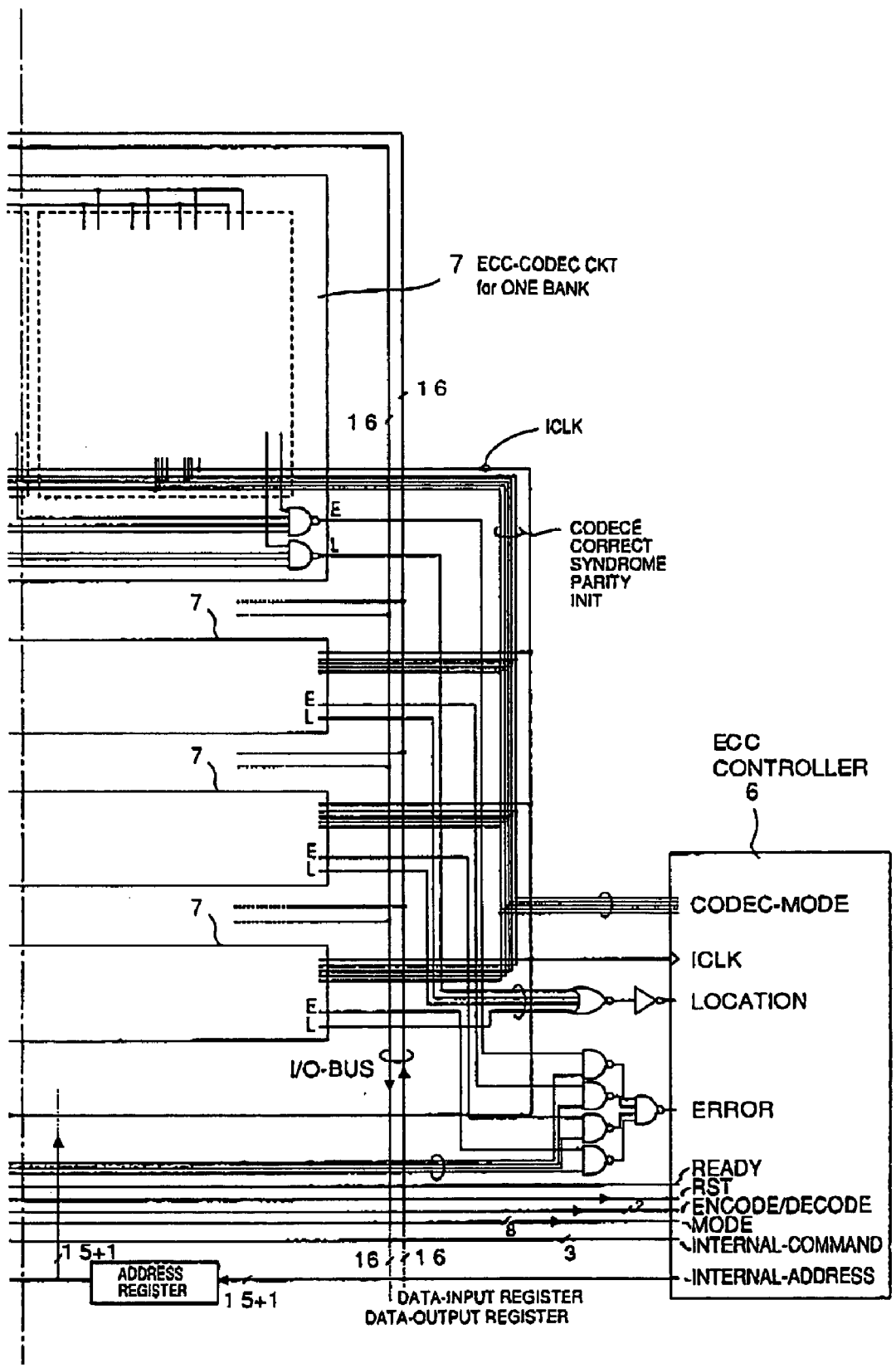
FIG. 31 is a view showing a right half of connection between the ECC controller and the ECC-CODEC circuit in the semiconductor integrated circuit device illustrated in FIG. 18.

Referring to FIGS. 30 and 31, connection among the ECC controller 6 and the ECC-CODEC circuit 7 in the structure illustrated in FIG. 18 is shown in detail. The ECC controller 6 supplies the CODEC mode signal (INIT, PARITY, SYNDROME, CORRECT, CODECE) in common to the ECC-CODECs (FIGS. 21 and 22), 64 in number. An ICLK generator supplies ICLK (internal synchronization clock signal) in common to the ECC controller 6 (or 6' in FIG. 11) and the control logic 209 of the SDRAM. The ICLK generator is supplied with an oscillation start instruction (ICLKON of HIGH) from the control logic 209 of the SDRAM and starts oscillation. On the contrary, when an oscillation stop instruction (ICLKON of LOW) is supplied, the ICLK generator stops oscillation. As the clock signal to the ECC-CODECs, the ICLK is converted through a CCLK generator (FIG. 25) into four synchronization clocks (CCLK, CCLKB, CCLK2, CCLK2B) to be supplied to every four ECC-CODECs in common. Thus, for 16 ECC-CODECs per each bank, four CCLK generators (FIG. 25) are arranged. The clock signals to the ECC-CODECs are produced when the CODECE (codec enable) signal is HIGH. Per each bank, four clock signals are supplied and individually controlled by the ECC controller 6 if necessary so that the operation per bank is possible. The output of the MA (main amplifier) has two lines including a normal bus and an output bus to the ECC-CODEC which are switched in correspondence to the normal mode and the super self-refresh mode. The data read out in the normal mode are sent through the normal bus and a common IO bus and buffered in the data output register to be delivered to the outside. The data read out in the parity generation/correcting operation in the super self-refresh mode pass through the output bus to the ECC-CODEC, buffered in the register circuit (FF in FIG. 30), and successively supplied to the shift registers in the ECC-CODEC. The WB (write buffer) also has two lines including a normal bus and an input bus from the ECC-CODEC which are switched In correspondence to the normal mode and the super self-refresh mode. In the normal mode, write data supplied from the outside are buffered in the data input register and sent through the common I/O bus and the normal bus to be supplied to the WB (write buffer). In the parity generation in the super self-refresh mode, the parity bits produced from the ECC-CODEC pass through the input bus from the ECC-CODEC and supplied to the WB (write buffer). Although not shown in FIGS. 30 and 31, the parity bits may be buffered in the register circuit and then supplied to the WB like in the normal mode. The ECC-CODEC supplies the error location detection signal LOCATION and the error detection signal ERROR to the ECC controller 6. The outputs of the ECC-CODECs, 16 in number, for each bank are subjected to OR operation to finally produce the error location detection signal LOCATION and the error detection signal ERROR for each bank. The error location detection signals LOCATION of four banks are simply subjected to OR operation to produce a single LOCATION signal which is supplied to the ECC controller 6. On the other hand, the error detection signals ERROR are AND'ed with the bank enable signal BAE(j) activated in correspondence to the PASR (partial self refresh) mode to produce a single ERROR signal which is supplied to the ECC controller 6. For example, if the PASR mode indicates two banks, the bank enable signals BAE(0) and BAE(1) are HIGH and others are LOW. Only the error detection signals ERROR from the banks 0 and 1 are OR'ed and supplied to the ECC controller 6. In this manner, the ERROR signals of the banks 2 and 3 which are not guaranteed of operation can be neglected. Therefore, in the ECC controller 6, it is possible to omit issuance and operation of the useless internal commands in the Correcting operation.

Figure 32:
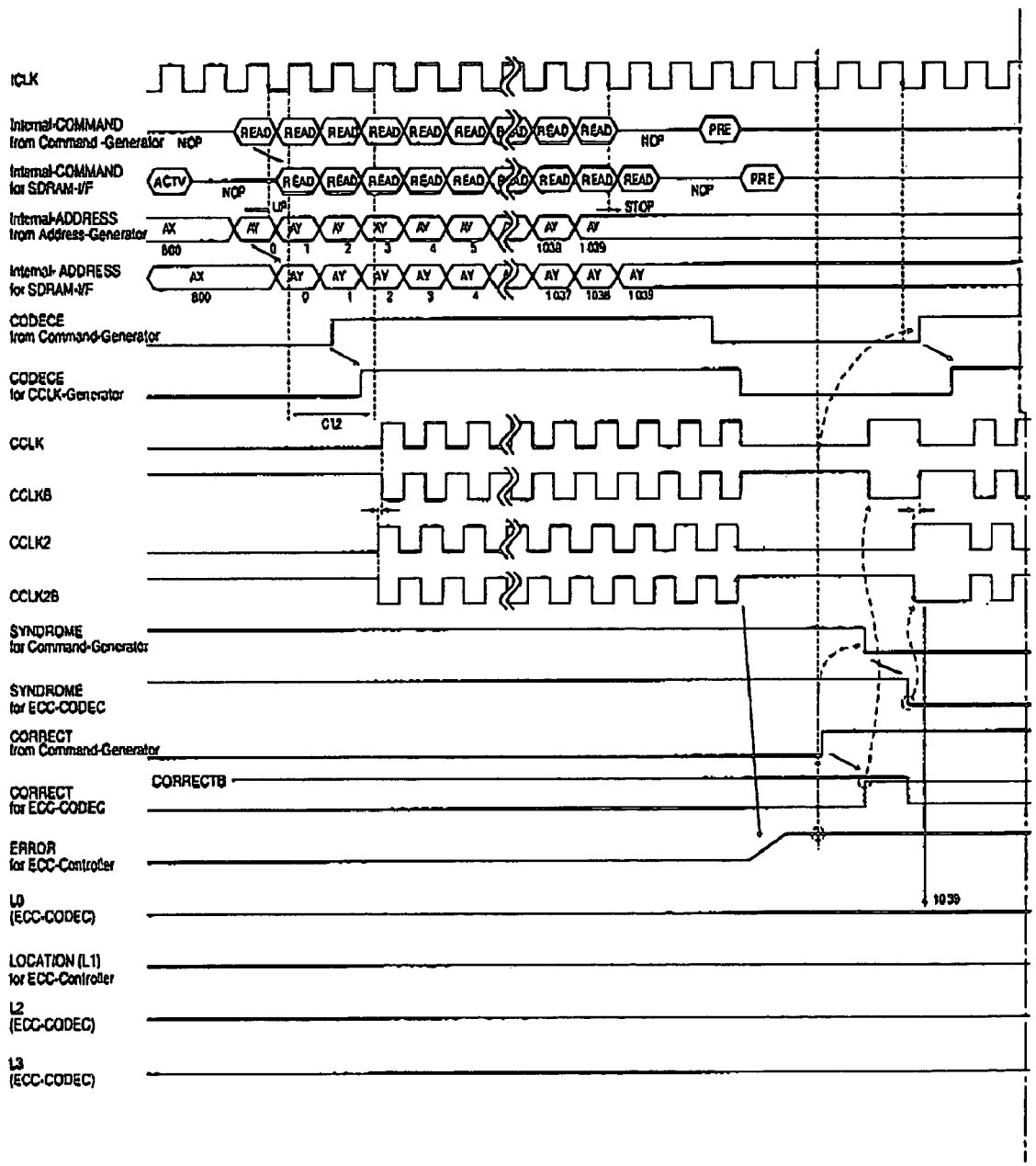
FIG. 32 is a view showing a left half of the super self-refresh operation from syndrome calculation to error location detection in case where the ECC controller illustrated in FIG. 11 and the ECC-CODEC circuit illustrated in FIGS. 21 and 22 are used.
Figure 33:
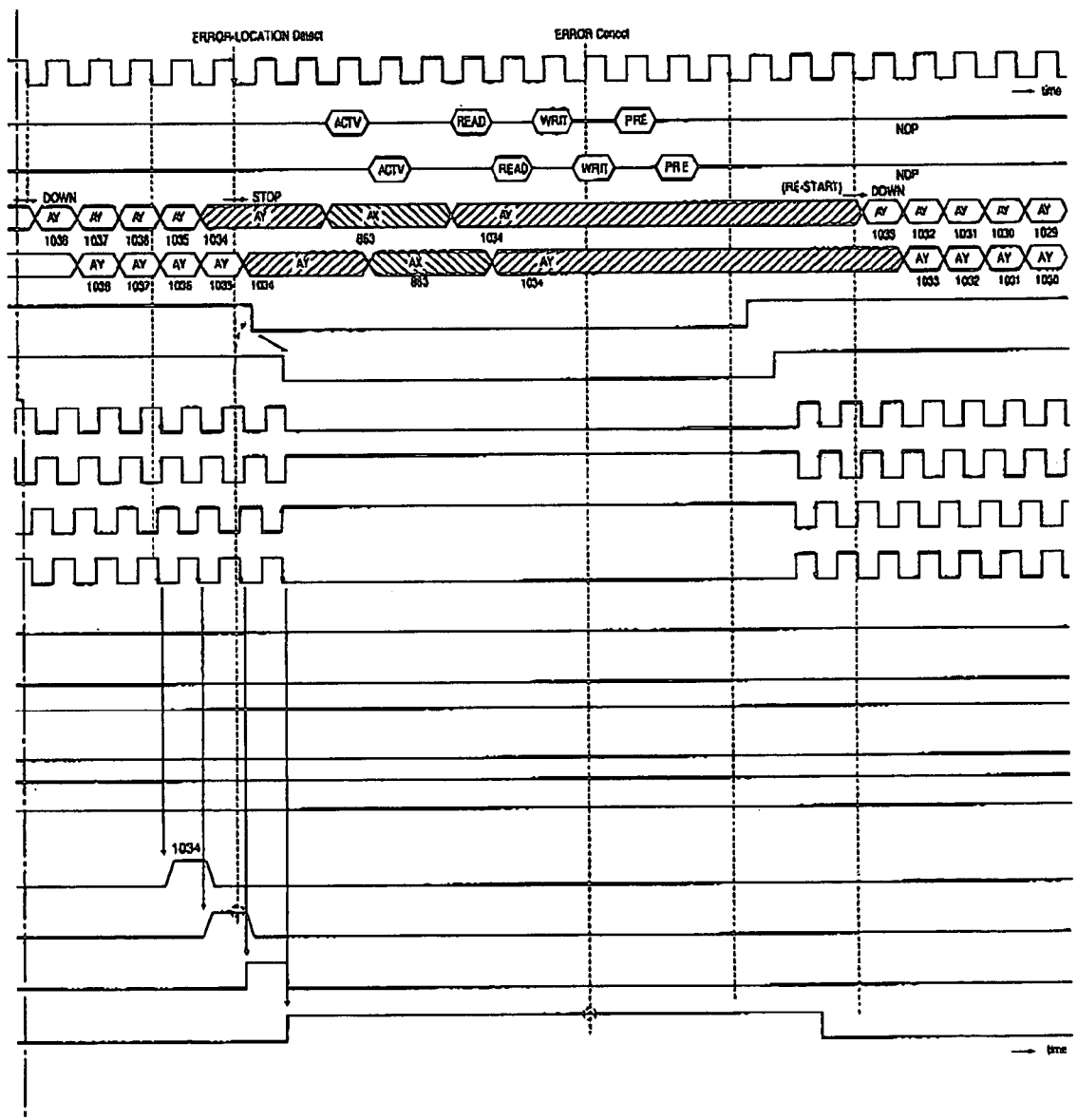
FIG. 33 is a view showing a right half of the super self-refresh operation from syndrome calculation to error location detection in case where the ECC controller illustrated in FIG. 11 and the ECC-CODEC circuit illustrated in FIGS. 21 and 22 are used.

Next referring to FIGS. 32 and 33, supplemental description will be made of the correcting operation in FIGS. 9 and 10. FIGS. 32 and 33 show the left half and the right half of details of operation (corresponding to the correcting operation in FIGS. 9 and 10) from the syndrome calculation to the error location detection In the super self-refresh operation in case where the ECC controller 6' in FIG. 11 and the ECC-CODEC circuit 7 in FIGS. 21 and 22 are used.

Output of the ECC controller 6' is carried out through the register circuits 14, 15, and 17. Therefore, the outputs of the command generator 11 and the address generator 12 are delayed by one cycle through the register circuits 14, 15, and 17. At first, in the syndrome calculation shown in FIG. 9, the stream of data is directed in one direction from the ECC controller to the control logic and the ECC-CODEC circuit. Therefore, only the output of the ECC controller is delayed by one cycle from the outputs of the command generator and the address generator, as in FIG. 9. The four clocks CCLK, CCLKB, CCLK2, CCLK2B supplied from the CCLK generator (FIG. 25) as a clock supplying circuit are set by the delay circuit DL1 (FIG. 25) so that the clocks CCLK and CCLKB are operated behind in comparison with the clocks CCLK2 and CCLK2B to assure an operation margin of the cyclic shift operation of the ECC-CODEC circuit. If the delay relationship is reversed, the shift registers will destroy the data. After completion of the issuance of the command of the syndrome calculation, the command generator accepts the error detection signal ERROR (ERROR Detect). In this event, the command generator waits the error detection signal ERROR with a margin for the delay time required for the error detection signal ERROR to reach the ECC controller after the outputs of the 64 ECC-CODEC circuits are produced and OR'ed. In the example illustrated in FIGS. 32 and 33, the error detection signal ERROR is received at a third cycle from the issuance of the last <PRE> command. If the error detection signal ERROR is HIGH, the ECC controller proceeds to the error location detection in the following manner. At first, the CORRECT signal is turned HIGH and CCLK and CCLKB are inverted and outputted irrespective of ICLK. In this operation, the data memorized in the shift register circuit (FIG. 23) are processed in the following manner. The data memorized in the left latch circuit are copied to the right latch circuit so that the data in the left and the right latch circuits become identical. In a next one cycle, the SYNDROME signal is turned LOW and the four clocks CCLK, CCLKB, CCLK2, CCLK2B are inverted. Simultaneously, CORRECTB is inverted and backward cyclic shift of one bit is carried out. Again, the clocks CCLK and CCLKB are operated behind in comparison with the clocks CCLK2 and CCLK2B to assure an operation margin of the shift operation. This is assured by the delay circuit DL2 of the CCLK generator (FIG. 25) as a clock supplying circuit. The delay relationship is always maintained also in subsequent clocking operations by the delay circuit DL1 of the CCLK generator (FIG. 25) as a clock supplying circuit. By controlling the SYNDROME and the CORRECT signals, the ECC-CODEC circuit proceeds from the syndrome mode into the correction mode. CCLK and CCLKB are reverse in phase to CCLK2 and CCLK2B so that backward cyclic shift can be carried out. By the one-bit shift mentioned above, the syndrome pattern for the bit read out from the memory cells at the last of the syndrome calculation appears in the shift registers of 16 bits in the ECC-CODEC. When only the uppermost or most significant bit is HIGH and the remaining bits are LOW, the error location detection signal LOCATION is HIGH and the ECC controller detects that the bit in question is in error. In order to carry out error judgment for a subsequent readout bit, the CODECE (codec enable) signal is turned HIGH. The four clocks CCLK, CCLKB, CCLK2, CCLK2B are supplied from the CCLK generator (FIG. 25) as the clock supplying circuit. Backward cyclic shift Is carried out and error detection in the subsequent readout bit is performed. In parallel, the address generator carries out backward shift of the internal address. The backward shift of the address is started three cycles after the CODECE (codec enable) signal is turned HIGH. In case where the error location detection signal LOCATION is turned HIGH as a result of the subsequent backward cyclic shift of the shift registers, the ECC controller is responsive to the error location detection signal LOCATION and turns the CODECE signal into LOW to stop the operation of the ECC-CODEC circuit. At first, in a cycle of receiving the LOCATION signal, one-cycle cyclic shift is carried out. Furthermore, since the output of the command generator is produced through the register circuits, the stop of the ECC-CODEC circuit is delayed by one cycle. The error location detection signal LOCATION is produced also through the registers and is therefore produced from the ECC-CODEC circuit with one-cycle delay. Therefore, the result of judgment one bit before is seen. Thus, the error location detection is delayed by three cycles. Therefore, the ECC-CODEC circuit (FIGS. 21 and 22) has three registers memorizing the LOCATION signal to memorize previous values back to the value (L3) three cycles before. By the value, inversion of the rewritten data is controlled (76 in FIG. 22). For this purpose, the address generator delays the internal address backward shift operation by three cycles. Supplied with the error location detection signal LOCATION of HIGH, the ECC controller issues the internal commands for stopping backward shift operation of the ECC-CODEC circuit and the address generator and for inverting the error bit and rewriting the corrected bit. By the delay control mentioned above, error judgment of the bit in question and the address are coincident and the error correction can properly be carried out. The ECC controller finishes the issuance of the internal command and, for a next error location detection, the backward cyclic shift of the ECC-CODEC circuit and backward shift operation of the address generator are started. Herein, the delay relationship by the three cycles is maintained.

As described above, according to this invention, it is possible to provide a semiconductor integrated circuit comprising an ECC controller for controlling an ECC-CODEC circuit under control of a control logic (CONTROL LOGIC) of a SDRAM. the ECC controller 6' is similar to the ECC controller 6 in FIG. 3.

Referring to FIG. 12, a BIST (built-in self-test: a self-diagnosis test contained in the device) controller 6" is used in the semiconductor integrated circuit device in FIG. 1 instead of the ECC controller 6. In this case, the ECC-CODEC circuit 7 is replaced by an error detection circuit (which will later be illustrated) in the semiconductor integrated circuit device in FIG. 1. Now, description will be made assuming that the ECC-CODEC circuit 7 in FIG. 1 is replaced by the error detection circuit.

Like the ECC controller 6' in FIG. 11, the BIST controller 6" comprises the command generator 11, the address generator 12, and the register circuits 13 through 17. The BIST controller 6" is different from the ECC controller 6' in the following respects.

The BIST controller 6" is supplied with the control signal (CHECK=start instruction signal, MODE=operation mode indication signal) 1 produced by the control logic 209 (FIG. 1) in the SDRAM 10 (FIG. 1) and delivers a BIST (built-in self-test: self-diagnosis test contained in the device) related signal (BISTR, BISTW, TPH, DCKE, ECKE) to the error detection circuit (instead of the ECC-CODEC circuit 7 in FIG. 1) as the operation mode signal 4. In addition, the BIST controller 6" produces internal addresses IXA(0)–IXA(12) and IYA(0)–IYA(8) and internal bank addresses IBA(0) and IBA(1) as the internal address 3.

Figure 13:
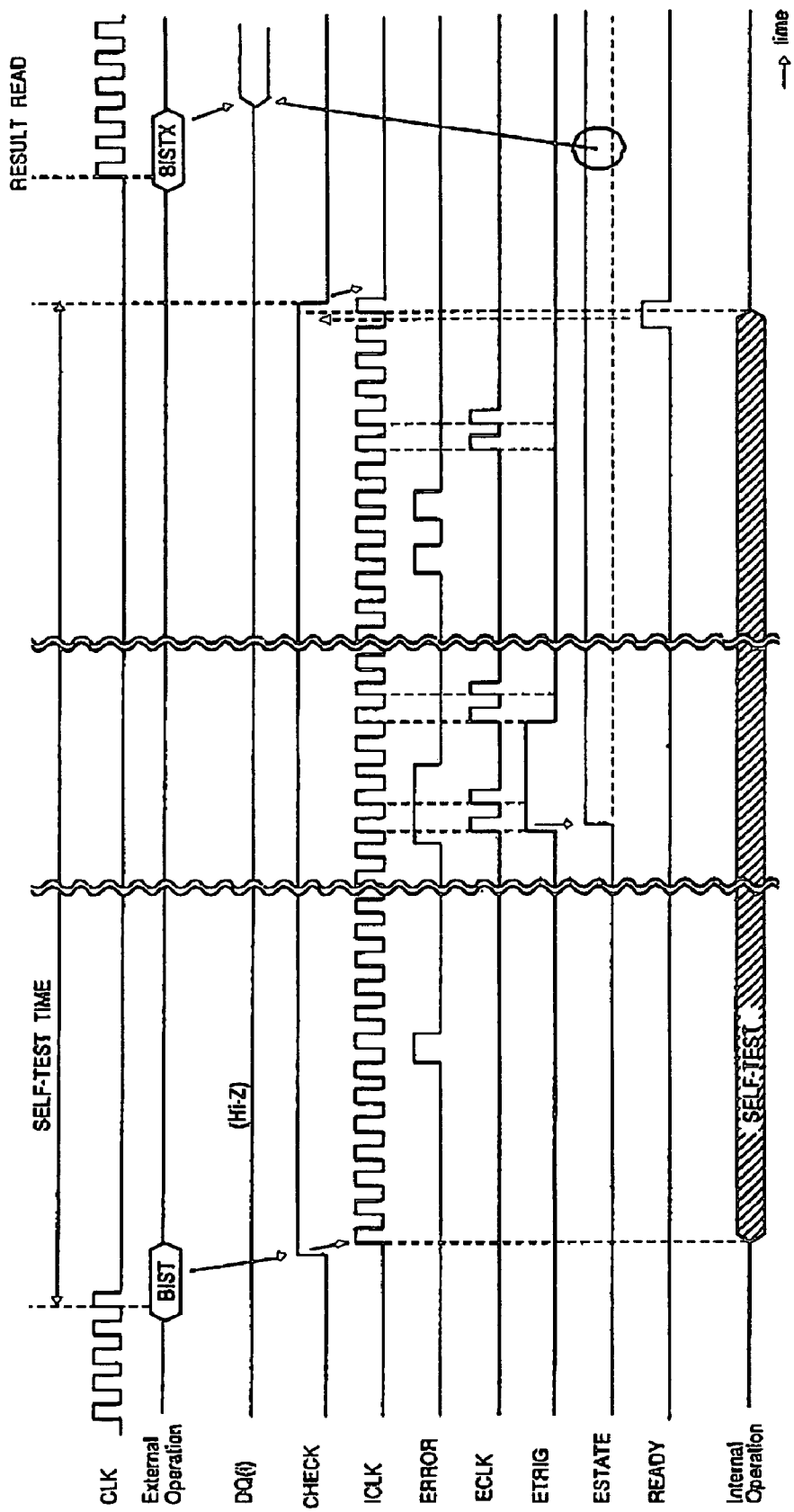
FIG. 13 shows an operation sequence related to a BIST function of the BIST controller illustrated in FIG. 12.

FIG. 13 shows an operation sequence related to the BIST function of the BIST controller 6" in FIG. 12.

Referring to FIG. 13, description will briefly be made of the self-test operation in case where the semiconductor integrated circuit device in FIG. 1 is provided with the BIST controller 6" in FIG. 12.

In the semiconductor integrated circuit device, the input buffer circuit (COMMAND DECODE) 8 of the control logic 209 of the SDRAM 10 decodes the external command as a combination of the CS, WE, CAS, and RAS signals.

What is claimed is:

1. A semiconductor integrated circuit device having a dynamic RAM, said dynamic RAM comprising a memory array, a RAM control section, an ECC-codec circuit, and an ECC controller, said RAM control section comprising a command decoding section responsive to an external command from the outside of said dynamic RAM for decoding the external command and a super self-refresh control circuit, said super self-refresh control circuit being contained within said RAM control section, wherein:

said command decoding section is also adapted to receive an internal command generated inside said dynamic RAM and to decode the internal command;

said ECC controller comprises a command generating section and an address generating section, said address generating section being contained within said ECC controller;

said command decoding section delivers a start instruction signal representative of encoding to said ECC controller when an entry command is decoded as the external command;

said command generating section of said ECC controller delivers, upon reception of the start instruction signal, a first operation mode signal representative of the encoding and simultaneously makes said address generating section of said ECC controller sequentially generate addresses corresponding to operation timings of the first operation mode signal and supplies the addresses to said memory array;

said ECC-codec circuit carries out, upon reception of the first operation mode signal, an encoding operation of producing a check bit for error detection/correction with reference to information data stored in said memory array and writes the check bit into a predetermined region of said memory array;

said command generating section of said ECC controller delivers, upon completion of the encoding operation by said ECC-codec circuit, a first end signal as the internal command to said command decoding section;

said super self-refresh control circuit of said RAM control section starts, when said command decoding section receives and decodes the first end signal as the internal command, a super self-refresh operation which has a refresh cycle lengthened within an allowable range of error occurrence by an error correcting operation using the check bit.

2. A semiconductor integrated circuit device as claimed in claim 1, wherein:

the entry command is supplied by a user to said dynamic RAM.

3. A semiconductor integrated circuit device as claimed in claim 1, wherein:

said command decoding section delivers, when an exit command as the external command is decoded, a stop instruction signal representative of decoding to said ECC controller;

said super self-refresh control circuit of said RAM control section finishes the super self-refresh operation when said command decoding section decodes the exit command;

said command generating section of said ECC controller delivers, upon reception of the stop instruction signal, a second operation mode signal representative of the decoding and simultaneously makes said address generating section of said ECC controller sequentially generate addresses corresponding to operation timings of the second operation mode signal and supplies the addresses to said memory array;

said ECC-codec circuit carries out, upon reception of the second operation mode signal, a decoding operation of reading the check bit for error detection/correction from the predetermined region of said memory array and corrects, with reference to the check bit and the information data stored in said memory array, an error in the information data to rewrite the information data;

said command generating section of said ECC controller delivers, upon completion of the decoding operation by said ECC-codec circuit, a second end signal as the internal command to said command decoding section.

4. A semiconductor integrated circuit device as claimed in claim 3, wherein:

said RAM control section automatically starts a self-refresh operation and holds data in response to the second end signal.

5. A semiconductor integrated circuit device as claimed in claim 3, wherein:

said RAM control section subsequently receives a refresh operation instruction from the outside and holds data.

6. A semiconductor integrated circuit device as claimed in claim 3, wherein:

the entry command and the exit command are supplied by a user to said dynamic RAM.

7. A semiconductor integrated circuit device having a dynamic RAM, said dynamic RAM comprising a memory array, a RAM control section, an error correction circuit, and a BIST (built-in self-test) controller, said RAM control section comprising a command decoding section responsive to an external command from the outside of said dynamic RAM for decoding the external command, wherein:

said command decoding section is also adapted to receive an internal command generated inside said dynamic RAM and to decode the internal command;

said BIST controller comprises a command generating section and an address generating section, said address generating section being contained within said BIST controller;

said command decoding section delivers a start instruction signal representative of checking to said BIST controller when a BIST entry command is decoded as the external command;

said command generating section of said BIST controller delivers, upon reception of the start instruction signal, an operation mode signal representative of the checking and simultaneously makes said address generating section of said BIST controller sequentially generate addresses corresponding to operation timings of the operation mode signal and supplies the addresses to said memory array;

said error correction circuit produces, upon reception of the operation mode signal, write data corresponding to the addresses sequentially generated, writes the write data into a predetermined region or an entire region of said memory array, produces expectation data corresponding to the addresses sequentially generated, compares the expectation data with information data read from said memory array, detects an error in the information data, and, upon completion of error detection, delivers an end signal as the internal command to said command decoding section;

delivery of the start instruction signal being stopped when said command decoding section receives and decodes the end signal as the internal command.

8. A semiconductor integrated circuit device as claimed in claim 7, wherein:

the BIST entry command is supplied by a user to said dynamic RAM.

9. A semiconductor integrated circuit as claimed in claim 7, wherein:

said BIST controller further comprises a register circuit which holds the result of the error detection;

said BIST controller makes said register circuit deliver the result of error detection to the outside when said command decoder receives a readout instruction as the external command.

10. A semiconductor integrated circuit device as claimed in claim 3, wherein:

said ECC-codec circuit further comprises a register circuit which holds an error detection signal of said ECC-codec circuit as a result of error detection;

said ECC-codec circuit makes said register circuit deliver the result of error detection to the outside when said command decoder receives a readout instruction as the external command.

11. A semiconductor integrated circuit device as claimed in claim 3, wherein:

said ECC controller further comprises a register circuit which holds an error location detection instruction of said ECC controller as a result of the error detection;

said ECC controller makes said register circuit deliver the result of error detection to the outside when said command decoder receives a readout instruction as the external command.

12. A semiconductor integrated circuit device as claimed in claim 3, wherein:

sequential decoding is used in decoding an error correction code in said super self-refresh operation, error location detection being executed by backward cyclic shift of a cyclic shift register, other operations being executed by forward cyclic shift.

* * * * *